United States Patent
Park et al.

(10) Patent No.: US 10,872,808 B2
(45) Date of Patent: Dec. 22, 2020

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Jin Ho Park, Seoul (KR); Sae Il Son, Suwon-si (KR); Hye Jun Jin, Seongnam-si (KR); Yun-Won Ha, Seongnam-si (KR)

(73) Assignee: SAMSUNG ELECTRONICS., LTD., Suwon-si (KR)

( * ) Notice: Subject to any disclaimer, the term of this patent is extended or adjusted under 35 U.S.C. 154(b) by 9 days.

(21) Appl. No.: 16/215,294

(22) Filed: Dec. 10, 2018

(65) Prior Publication Data

US 2019/0311944 A1    Oct. 10, 2019

(30) Foreign Application Priority Data

Apr. 6, 2018    (KR) .................... 10-2018-0040254

(51) Int. Cl.
*H01L 21/768* (2006.01)
*H01L 23/522* (2006.01)

(52) U.S. Cl.
CPC .. *H01L 21/76808* (2013.01); *H01L 21/76816* (2013.01); *H01L 21/76826* (2013.01); *H01L 21/76831* (2013.01); *H01L 23/5226* (2013.01)

(58) Field of Classification Search
CPC ......... H01L 21/76808; H01L 21/76826; H01L 21/76816; H01L 21/76831; H01L 23/5226; H01L 2221/1026; H01L 2221/1031; H01L 2221/1036
See application file for complete search history.

(56) References Cited

U.S. PATENT DOCUMENTS

| | | | |
|---|---|---|---|
| 6,514,860 B1 | 2/2003 | Okada et al. | |
| 7,179,757 B2 * | 2/2007 | RamachandraRao | ........................ H01L 21/76808 257/E21.577 |
| 7,192,863 B2 * | 3/2007 | Zhijian | ............. H01L 21/76808 257/E21.579 |
| 7,232,748 B2 | 6/2007 | Ali | |
| 7,307,015 B2 | 12/2007 | Lee | |

(Continued)

FOREIGN PATENT DOCUMENTS

| | | |
|---|---|---|
| JP | 5060129 | 8/2012 |
| KR | 100690881 | 3/2007 |
| WO | WO2005/029556 | 3/2005 |

*Primary Examiner* — Michael M Trinh
(74) *Attorney, Agent, or Firm* — F. Chau & Associates, LLC

(57) ABSTRACT

An etch stop layer is formed on a lower wiring. An interlayer insulating film covers the lower wiring and the etch stop layer. A via exposes an upper surface of the etch stop layer, in the interlayer insulating film. A first filler is formed in the via. The first filler is etched to a first filler pattern. A second filler is formed on the first filler pattern and is etched to a second filler pattern. A trench is formed by etching the interlayer insulating film. The first and second filler patterns are etched during the forming of the trench to form a residual filler pattern. The residual filler pattern and the etch stop layer are removed and a wiring structure is formed electrically connected to the lower wiring. The via includes lower and upper portions and the trench includes the upper portion of the via.

20 Claims, 24 Drawing Sheets

(56) References Cited

U.S. PATENT DOCUMENTS

| | | |
|---|---|---|
| 7,348,281 B2 | 3/2008 | Brakensiek et al. |
| 7,439,171 B2 | 10/2008 | Soda et al. |
| 7,541,276 B2 | 6/2009 | Kim et al. |
| 7,598,172 B2 | 10/2009 | Terasaki et al. |
| 7,602,066 B2 | 10/2009 | Brakensiek et al. |
| 7,655,554 B2 * | 2/2010 | XiangHui .......... H01L 21/76808 438/622 |
| 2006/0223309 A1 * | 10/2006 | Ho .................... H01L 21/76808 438/652 |

* cited by examiner

SEMICONDUCTOR DEVICE AND METHOD OF FABRICATING THE SAME

This application claims the benefit of and priority to Korean Patent Application No. 10-2018-0040254, filed on Apr. 6, 2018, in the Korean Intellectual Property Office, the disclosure of which is herein incorporated by reference in its entirety.

TECHNICAL FIELD

The present disclosure relates to a semiconductor device and a method of fabricating the same.

DISCUSSION OF THE RELATED ART

Some modern semiconductor devices use copper interconnections. As copper is a better conductor of electricity than aluminum, semiconductors using copper may be made more efficient with less unwanted heat generated by their use. However, copper cannot generally be etched into a desired pattern by photolithography, as aluminum is, and so a process known as dual damascene may be used to fabricate the copper interconnections. According to this process, a trench may be etched within the semiconductor. Copper is then overfilled in the trench and then the semiconductor may be planarized to remove the copper that is raised above the trench. In a semiconductor dual damascene process, an etching process for forming the trench can cause damage to lower wiring. To prevent this, a filler is formed inside a via. However, if the filler is not thick enough, the lower wiring can still be damaged despite the presence of the filler.

However, it may be difficult to obtain a sufficiently thick filler by a single process due to the constraints of semiconductor processing equipment.

SUMMARY

A method of fabricating a semiconductor device includes forming a lower wiring. An etch stop layer is formed on the lower wiring. An interlayer insulating film is formed covering the lower wiring and the etch stop layer. A via is formed in the interlayer insulating film. The via exposes an upper surface of the etch stop layer. A first filler is formed in the via. The first filler is etched to form a first filler pattern. A second filler is formed on the first filler pattern within the via. The second filler is etched to form a second filler pattern. The interlayer insulating film is etched to form a trench. The first and second filler patterns are etched, during the forming of the trench, to form a residual filler pattern. The residual filler pattern and the etch stop layer are removed. A wiring structure is formed within the via and the trench. The wiring structure is electrically connected to the lower wiring. The via includes a lower portion and an upper portion disposed on the lower portion. The trench includes the upper portion of the via.

A method of fabricating a semiconductor device includes forming a lower wiring. An interlayer insulating film is formed covering the lower wiring. The interlayer insulating film disposed on the lower wiring is etched to form a via. The via is filled to form a filler pattern. The interlayer insulating film is etched to form a trench that is connected to the via. A portion of the filler pattern is etched when the trench is formed. The filler pattern is removed. A wiring structure is formed within the via and the trench. The wiring structure is electrically connected to the lower wiring. Sidewalls of the via include a damaged region contacting a bottom surface of the trench and an undamaged region disposed below the damaged region. A carbon content of the damaged region is lower than that of the undamaged region.

A method of fabricating a semiconductor device includes forming first and second lower wirings at different depths within an interlayer insulating film. The interlayer insulating film is etched to form first and second vias on the first and second lower wirings, respectively. First and second filler patterns are formed filling the first and second vias, respectively. The interlayer insulating film is etched to form a first trench connected to the first via on the first via and to form a second trench connected to the second via on the second via. A first wiring structure is formed filling the first via and the first trench. A second wiring structure is formed filling the second via and the second trench. The forming of the first filler pattern includes forming a first filler n times and etching back the first filler n times. The forming of the second filler pattern includes forming a second filler n times and etching back the second filler in times. Here, n is a natural number of 2 or more.

BRIEF DESCRIPTION OF THE DRAWINGS

A more complete appreciation of the present disclosure and many of the attendant aspects thereof will be readily obtained as the same becomes better understood by reference to the following detailed description taken in conjunction with the accompanying drawings, in which.

DETAILED DESCRIPTION

Figure 1:
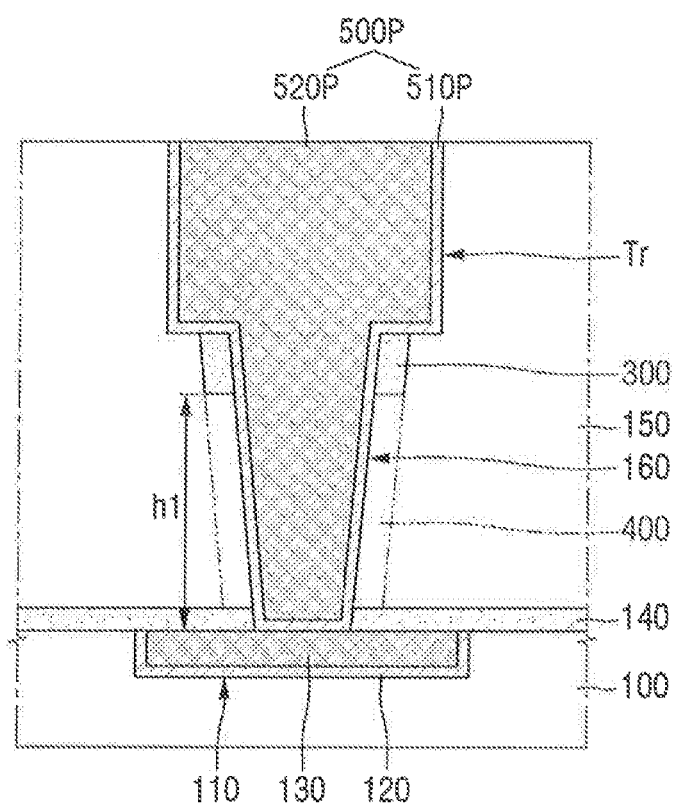
FIG. 1 is a cross-sectional view illustrating a semiconductor device according to exemplary embodiments of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

A semiconductor device, according to exemplary embodiments of the present disclosure will now be described with reference to FIG. 1.

FIG. 1 is a cross-sectional view illustrating a semiconductor device according to exemplary embodiments of the present disclosure.

Referring to FIG. 1, the semiconductor device may include a lower interlayer insulating film 100, a first lower trench 110, a first lower barrier pattern 120, a first lower wiring pattern 130, a first etch stop layer 140, an upper interlayer insulating film 150, a first via 160, a trench Tr, a first wiring structure 500P, a first damaged region 300, and an undamaged region 400.

The lower interlayer insulating film 100 may include the first lower trench 110. The lower interlayer insulating film 100 may be a structure for insulating the first lower wiring pattern 130 formed in the first lower trench 110 from other elements.

Additionally, other elements may be formed under the lower interlayer insulating film 100. These elements may be semiconductor elements electrically connected to the first lower wiring pattern 130. For example, the semiconductor elements may include transistors.

The lower interlayer insulating film 100 may include silicon oxide, silicon nitride, silicon oxynitride, and/or a low dielectric constant material. When the lower interlayer insulating film 100 includes a low dielectric constant material, a coupling phenomenon between the first lower wiring pattern 130 and other elements can be reduced.

The low dielectric constant material may be, for example, silicon oxide with moderately high carbon and hydrogen contents or may be a material such as SiCOH. Since carbon is contained in an insulating material, the dielectric constant of the insulating material is lowered. To further lower the dielectric constant of the insulating material, the insulating material may include pores such as cavities filled with gas or air.

In addition, the low dielectric constant material may include, but is not limited to including, fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), tonen silazen (TOSZ), fluoride silicate glass (FSG), polyimide nanofoams such as polypropylene oxide, carbon doped silicon oxide (CDO)), organo silicate glass (OSG), SiLK, amorphous fluorinated carbon, silica aerogels, silica xerogels, and/or mesoporous silica.

The lower interlayer insulating film 100 may be formed using, for example, chemical vapor deposition (CVD), spin coating, plasma enhanced CVD (PECVD), or high density plasma CVD (HDP-CVD).

The first lower trench 110 may be formed in the lower interlayer insulating film 100. The first lower trench 110 may be formed by etching the lower interlayer insulating film 100. The first lower trench 110 may be a space filled with the first lower barrier pattern 120 and the first lower wiring pattern 130. Accordingly, the first lower trench 110 may extend in a direction in which the first lower barrier pattern 120 and the first lower wiring pattern 130 extend.

The first lower barrier pattern 120 may be formed along a bottom surface and side surfaces of the first lower trench 110. The first lower barrier pattern 120 may partially fill the first lower trench 110. The first lower barrier pattern 120 may include, for example, tantalum (Ta), tantalum nitride (TaN), titanium (Ti), titanium nitride (TiN), ruthenium (Ru), cobalt (Co), nickel (Ni), nickel boron (NiB), tungsten nitride (WN), zirconium (Zr), zirconium nitride (ZrN), vanadium (V), vanadium nitride (VN), niobium (Nb), and/or niobium nitride (NbN). Although the first lower barrier pattern 120 is illustrated as a single layer, it may include a plurality of layers.

The first lower wiring pattern 130 may be formed on the first lower barrier pattern 120. The first lower wiring pattern 130 may completely fill the first lower trench 110. Therefore, the first lower trench 110 may be completely filled with the first lower barrier pattern 120 and the first lower wiring pattern 130.

The first lower wiring pattern 130 may include a conductive material. The first lower wiring pattern 130 may include, for example, aluminum (Al), copper (Cu), tungsten (W), cobalt (Co), or a combination of these materials.

The first etch stop layer 140 may be formed on exposed upper surfaces of the first lower barrier pattern 120 and the first lower wiring pattern 130. The first etch stop layer 140 may also be formed on an upper surface of the lower interlayer insulating film 100. However, the first etch stop layer 140 may be alternatively formed. For example, the first etch stop layer 140 of the semiconductor device, according to exemplary embodiments of the present disclosure, may be formed exclusively on the first lower barrier pattern 120 and the first lower wiring pattern 130.

The first etch stop layer 140 may serve as a capping layer for protecting the first lower barrier pattern 120 and the first lower wiring pattern 130. The first etch stop layer 140 may include silicon nitride (SiN) and/or silicon carbonitride (SiCN). The first etch stop layer 140 may be formed using, for example, CVD or atomic layer deposition (ALD).

The upper interlayer insulating film 150 may be formed on the first etch stop layer 140. The upper interlayer insulating film 150 may directly contact an upper surface of the first etch stop layer 140.

The upper interlayer insulating film 150 may include silicon oxide, silicon nitride, silicon oxynitride, and/or a low dielectric constant material. The low dielectric constant material may be, for example, silicon oxide with moderately high carbon and hydrogen contents or may be a material such as SiCOH. Since carbon is contained in an insulating material, the dielectric constant of the insulating material is lowered. To further lower the dielectric constant of the insulating material, the insulating material may include pores such as cavities filled with gas or air.

In addition, the low dielectric constant material may include, but is not limited to including, fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), tonen silazen (TOSZ), fluoride silicate glass (FSG), polyimide nanofoams such as polypropylene oxide, carbon doped silicon oxide (CDO)), organo silicate glass (OSG), SiLK, amorphous fluorinated carbon, silica aerogels, silica xerogels, and/or mesoporous silica.

The upper interlayer insulating film 150 may be formed using, for example, CVD, spin coating, PECVD, or HDP-CVD.

The first via 160 may be formed in the upper interlayer insulating film 150. The first via 160 may be formed in a vertical direction. A horizontal cross-section of the first via 160 may be, for example, circular. The first via 160 may also be formed in the first etch stop layer 140. For example, the first via 160 may pass through the upper interlayer insulating film 150 and the first etch stop layer 140 to expose the upper surface of the first lower wiring pattern 130. Sidewalls of the first via 160 may be the upper interlayer insulating film 150 and the first etch stop layer 140.

The trench Tr may be connected to an upper end of the first via 160. The trench Tr may be wider than the first via 160. Accordingly, a portion of a bottom surface of the trench Tr may be recessed from the first via 160. For example, as illustrated in the drawing, the first via 160, having a horizontal area smaller than the area of the bottom surface of the trench Tr, may be formed on the bottom surface of the trench Tr.

Since the trench Tr includes a wiring structure, the trench may extend in a horizontal direction, unlike the first via 160. However, the present disclosure is not limited to this case and the trench Tr may extend in other directions.

The first wiring structure 500P may fill both the trench Tr and the first via 160. The first wiring structure 500P may directly contact the first lower wiring pattern 130. The first wiring structure 500P may be electrically connected to the first lower wiring pattern 130. The first wiring structure 500P may be a structure in which a wiring structure and a via structure are integrally formed. For example, the first wiring structure 500P may be formed by a dual damascene process.

The first wiring structure 500P may include a first upper barrier pattern 510P and a first upper wiring pattern 520P. The first upper barrier pattern 510P may be formed along the bottom surface and sidewalls of the first via 160. In addition, the first upper barrier pattern 510P may be formed along the bottom surface and sidewalls of the trench Tr. For example, the first upper barrier pattern 510P may be formed along inner walls of the trench Tr and the first via 160.

The first upper barrier pattern 510P may include, for example, tantalum (Ta), tantalum nitride (TaN), titanium (Ti), titanium nitride (TiN), ruthenium (Ru), cobalt (Co), nickel (Ni), nickel boron (NiB), tungsten nitride (WN), zirconium (Zr), zirconium nitride (ZrN), vanadium (V), vanadium nitride (VN), niobium (Nb), and/or niobium nitride (NbN). Although the first upper barrier pattern 510P is illustrated as a single layer, it can include a plurality of layers.

The first upper wiring pattern 520P may be formed on the first upper barrier pattern 510P. The first upper wiring pattern 520P may completely fill the first via 160 and the trench Tr. Therefore, the first via 160 and the trench Tr may be completely filled with the first upper barrier pattern 510P and the first upper wiring pattern 520P.

The first upper wiring pattern 520P may include a conductive material. The first upper wiring pattern 520P may include, for example, aluminum (Al), copper (Cu), tungsten (W), and/or cobalt (Co).

The upper interlayer insulating film 150 may include the first damaged region 300 and the undamaged region 400 formed along the sidewalls of the first via 160. The first damaged region 300 may be formed on the sidewalls of the first via 160 and may be formed on the undamaged region 400.

The undamaged region 400 may be the same as the other portion of the upper interlayer insulating film 150. The undamaged region 400 is a portion located along the sidewalls of the first via 160. The undamaged region 400 and the damaged region 300 are two parts of a single structure and the designations of "damaged region 400" and "undamaged region 300" are used for comparison.

The first damaged region 300 may have a lower carbon content than the other portion of the upper interlayer insulating film 150 and the undamaged region 400. For example, a surface of the upper interlayer insulating film 150, which is exposed by an etch-back process, may be damaged to form the first damaged region 300. When the upper interlayer insulating film 150 is damaged by, e.g., plasma in the etch-back process, carbon components inside the upper interlayer insulating film 150 may flow out of the upper interlayer insulating film 150. Accordingly, unlike the undamaged region 400 and the other portion of the upper interlayer insulating film 150, the first damaged region 300 may have a reduced carbon content.

A lower end of the first damaged region 300 may be located at a first height h1 from the upper surface of the first lower wiring pattern 130. For example, the first damaged region 300 may be formed along the sidewalls of the first via 160 from the first height h1 to the bottom surface of the trench Tr. The undamaged region 400 may be formed along the sidewalls of the first via 160 from the first height h1 to the upper surface of the first etch stop layer 140.

In the semiconductor device according to exemplary embodiments of the present disclosure, a filler addition process may be performed to prevent the first lower wiring pattern 130 from being damaged in the process of forming the first via 160 and the trench Tr. The filler addition process is described in more detail below.

Due to the filler addition process, the first lower wiring pattern 130 might not be damaged at all in the process of forming the first via 160 and the trench Tr, and only the first damaged region 300 may be damaged. Since the first damaged region 300 is not connected to other elements, it does not affect the reliability of the semiconductor device. Therefore, the reliability and precision of the semiconductor device can be increased because the first via 160 and the trench Tr can be formed without damaging the first lower wiring pattern 130.

A semiconductor device, according to exemplary embodiments of the present disclosure, will now be described with reference to FIG. 2. To the extent that a detailed description of certain elements is not provided, it may be assumed that those elements are at least similar to corresponding elements that have already been described.

Figure 2:
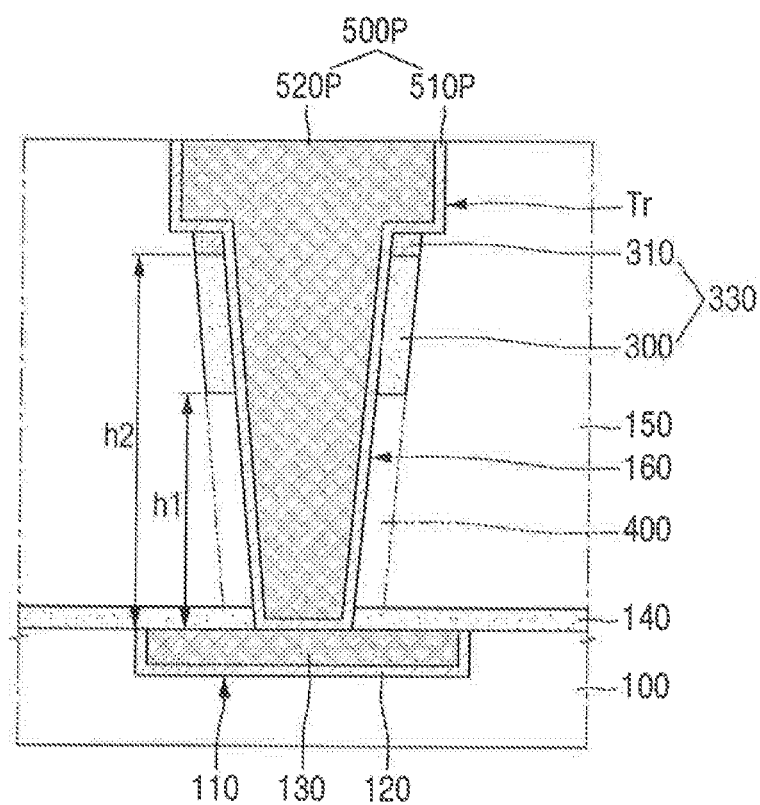
FIG. 2 is a cross-sectional view illustrating a semiconductor device according to exemplary embodiments of the present disclosure.

FIG. 2 is a cross-sectional view illustrating a semiconductor device according to exemplary embodiments of the present disclosure.

Referring to FIG. 2, an upper interlayer insulating film 150 may include a damaged region 330.

The damaged region 330 includes a first damaged region 300 and a second damaged region 310. The first damaged region 300 may be formed along sidewalls of a first via 160 between a first height h1 and a second height h2. The second damaged region 310 may be formed along the sidewalls of the first via 160 between the second height h2 and a bottom surface of a trench Tr. For example, the second damaged region 310 may be located on the first damaged region 300.

The first damaged region 300 may have a lower carbon content than an undamaged region 400 and the other portion of the upper interlayer insulating film 150, and the second damaged region 310 may have a lower carbon content than the first damaged region 300.

For example, the carbon content of the undamaged region 400 may be greatest, followed by the carbon content of the first damaged region 300, and then the carbon content of the second damaged region 310. Here, the carbon content of the undamaged region 400 may be equal to that of the other portion of the upper interlayer insulating film 150, excluding the damaged region 330.

In the semiconductor device, according to exemplary embodiments of the present disclosure, the damaged region 330 may include two regions, for example, the first damaged region 300 and the second damaged region 310, by virtue of two or more etch-back processes.

For example, the second damaged region 310, which is damaged more by two etch-back processes, may have a lower carbon content than the first damaged region 300.

In the semiconductor device, according to exemplary embodiments of the present disclosure, the height of a filler formed in the first via 160 can be increased by two or more etch-back processes. This is described in more detail below. Accordingly, since a first lower wiring pattern 130 is not damaged in the process of forming the trench Tr, the semiconductor device can have higher reliability.

A semiconductor device, according to exemplary embodiments of the present disclosure, will now be described with reference to FIG. 3. To the extent that a detailed description of certain elements is not provided, it may be assumed that those elements are at least similar to corresponding elements that have already been described.

Figure 3:
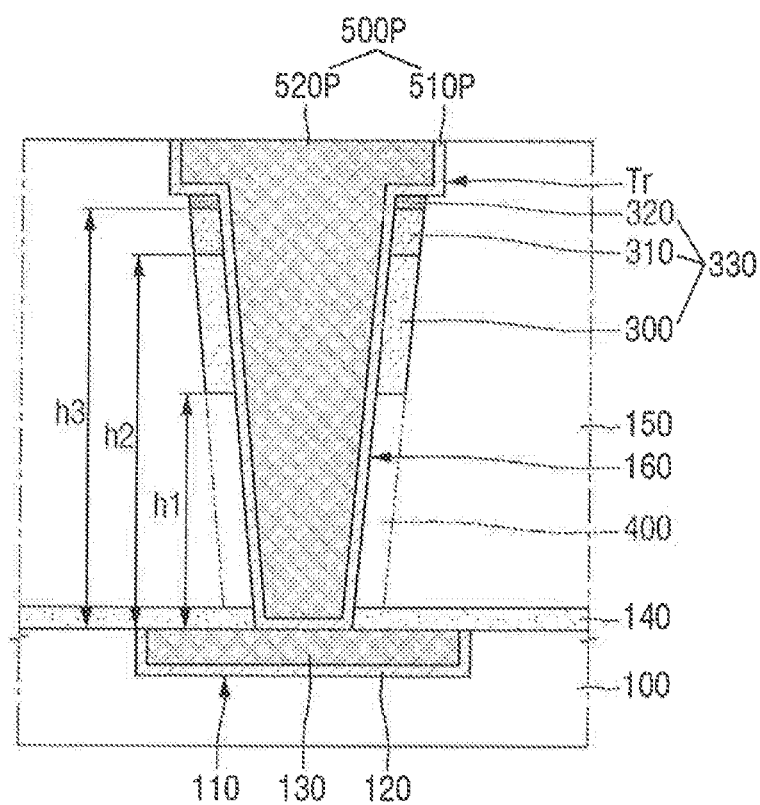
FIG. 3 is a cross-sectional view illustrating a semiconductor device according to exemplary embodiments of the present disclosure.

FIG. 3 is a cross-sectional view illustrating a semiconductor device according to exemplary embodiments of the present disclosure.

Referring to FIG. 3, an upper interlayer insulating film 150 may include a damaged region 330.

The damaged region 330 includes a first damaged region 300, a second damaged region 310, and a third damaged region 320. The first damaged region 300 may be formed along sidewalls of a first via between a first height h1 and a second height h2. The second damaged region 310 may exist between the second height h2 and a third height h3. The third damaged region 320 may be formed along the sidewalls of the first via 160 between the third height h3 and a bottom surface of a trench Tr. For example, the third damaged region 320 may be located on the second damaged region 310.

The third damaged region 320 may have a lower carbon content than the second damaged region 310. For example, the carbon content of the upper interlayer insulating film 150 may be greatest in the undamaged region 400, less great in the first damaged region 300, even less great in the second damaged region 310, and the least great in the third damaged region 320. Here, the carbon content of the undamaged region 400 may be equal to that of the other portion of the upper interlayer insulating film 150, excluding the damaged region 330.

In the semiconductor device, according to exemplary embodiments of the present disclosure, the damaged region 330 may include three regions, e.g., the first damaged region 300, the second damaged region 310, and the third damaged region 320 through three or more etch-back processes. For example, the third damaged region 320, which is damaged more by three etch-back processes, may have a lower carbon content than the second damaged region 310.

In the semiconductor device, according to exemplary embodiments of the present disclosure, the height of a filler formed in the first via 160 can be increased by three or more etch-back processes. This is described in more detail below. Accordingly, since a first lower wiring pattern 130 is not damaged in the process of forming the trench Tr, the semiconductor device can have higher reliability.

As described above with reference to FIGS. 1 through 3, the height of a filler is increased by two or more etch-back processes according to exemplary embodiments of the present disclosure. Therefore, a damaged region can exist in various structures. For example, a maximum of two damaged regions can be formed by two etch-back processes, and a maximum of three damaged regions can be formed by three etch-back processes. Here, the terms "two" and "three" may each refer to the number of damaged regions having different carbon contents.

In FIGS. 1 through 3, the semiconductor devices including two and three damaged regions have been described. However, the number of damaged regions can be increased according to the number of etch-back processes that are performed. For example, when n etch-back processes are performed, a maximum of n damaged regions having different concentrations of carbon can be formed. Here, n may be a natural number of 2 or more.

A semiconductor device, according to exemplary embodiments of the present disclosure, will now be described with reference to FIG. 4. To the extent that a detailed description of certain elements is not provided, it may be assumed that those elements are at least similar to corresponding elements that have already been described.

Figure 4:
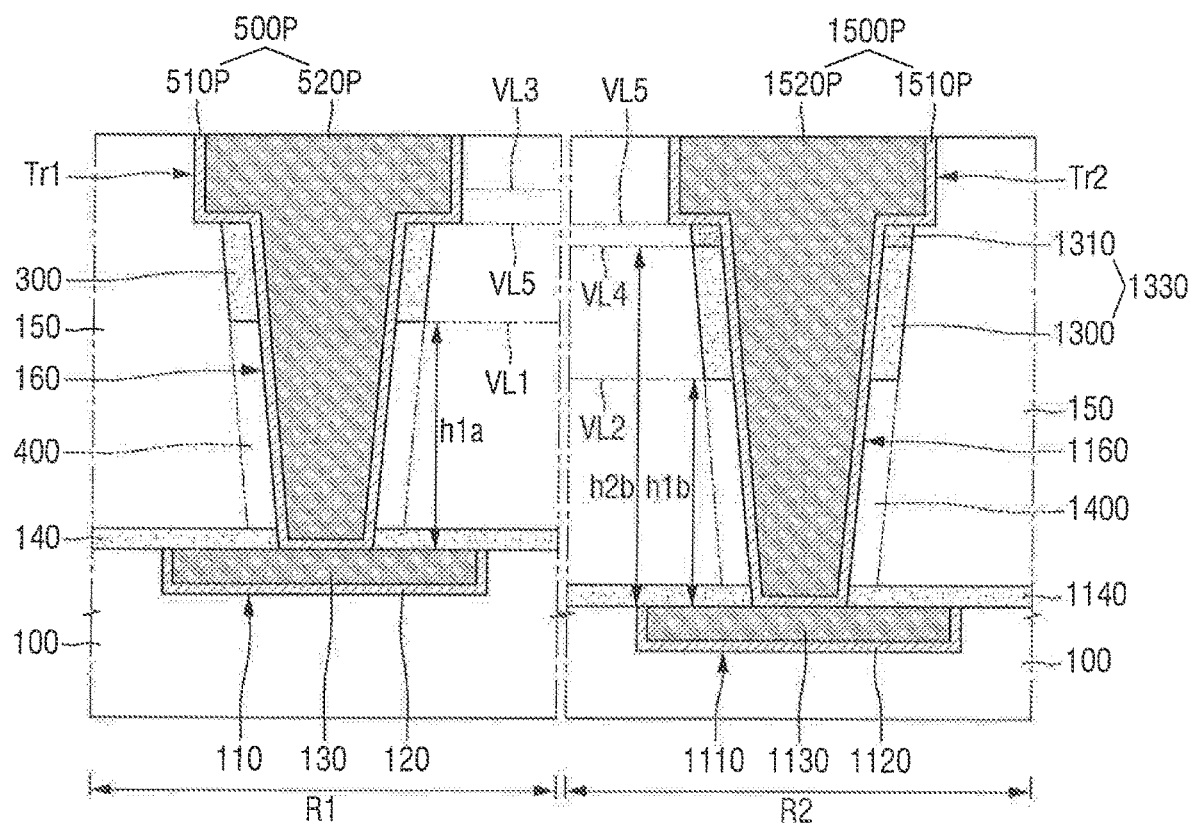
FIG. 4 is a cross-sectional view illustrating a semiconductor device according to exemplary embodiments of the present disclosure.

FIG. 4 is a cross-sectional view illustrating a semiconductor device according to exemplary embodiments of the present disclosure.

Referring to FIG. 4, a lower interlayer insulating film 100 of the semiconductor device may include a first area R1 and a second area R2. The first area R1 and the second area R2 may be adjacent to each other or may be spaced apart from each other. The first area R1 may have a structure similar to that of the semiconductor device of FIG. 1, and the second area R2 may have a structure similar to that of the semiconductor device of FIG. 2.

In the first area R1, a first damaged region 300 may be located between a first height h1a of the first area R1 and a first trench Tr1. Here, the first height h1a of the first area R1 may be expressed as a first vertical level VL1.

A height of a bottom surface of the first trench Tr1 may be expressed as a fifth vertical level VL5. A third vertical level VL3 may be a height at which a second damaged region is formed in a process. However, the second damaged region might not exist in the first area R1 of FIG. 4 due to the formation of the first trench Tr1. For example, since the fifth vertical level VL5 is lower than the third vertical level VL3, the first area R1 may only have a first damaged region 300.

Referring to the second area R2, a second lower trench 1110 may be formed in the lower interlayer insulating film 100, and a second lower barrier pattern 1120 and a second lower wiring pattern 1130 may be formed in the second lower trench 1110.

A second etch stop layer 1140 may be formed on an upper surface of the lower interlayer insulating film 100, an upper surface of the second lower barrier pattern 1120, and an upper surface of the second lower wiring pattern 1130. An upper surface of the second etch stop layer 1140 may be at a lower height than an upper surface of a first etch stop layer 140 of the first area R1.

An upper interlayer insulating film 150 is formed on the second etch stop layer 1140 and is etched to form a second via 1160 and a second trench Tr2. Here, the second via 1160 may be formed deeper than a first via 160 to expose a portion of the upper surface of the second lower wiring pattern 1130. However, the second trench Tr2 may be formed to a depth to which the first trench Tr1 is formed.

A second wiring structure 1500P may fill the second via 1160 and the second trench Tr2. The second wiring structure 1500P may include a second upper barrier pattern 1510P and a second upper wiring pattern 1520P. The second upper barrier pattern 1510P may be formed along bottom surfaces and side surfaces of the second via 1160 and the second trench Tr2. The second upper wiring pattern 1520P may completely fill the second via 1160 and the second trench Tr2.

A damaged region 1330 of the second area R2 may include a first damaged region 1300 of the second area R2 and a second damaged region 1310 of the second area R2.

The first damaged region 1300 of the second area R2 may be formed along the side surfaces of the second via 1160 between a first height h1*b* and a second height h2 of the second area R2. The second damaged region 1310 of the second area R2 may be formed between the second height h2*b* of the second area R2 and the bottom surface of the second trench Tr2. Here, the first height h1*b* of the second area R2 may be expressed as a second vertical level VL2, and the second height h2*b* of the second area R2 may be expressed as a fourth vertical level VL4.

The first vertical level VL1 may be higher than the second vertical level VL2, and the third vertical level VL3 may be higher than the fourth vertical level VL4. This may be a result arising from a height difference between a first lower wiring pattern 130 and the second lower wiring pattern 1130.

The bottom surface of the second trench Tr2 may be located at the fifth vertical level VL5 at which the bottom surface of the first trench Tr1 is located. For example, since the first trench Tr1 and the second trench Tr2 are formed simultaneously, they may be formed to the same depth.

Since the first trench Tr1 and the second trench Tr2 have the same depth although the first and second vias 160 and 1160 have different depths, a damaged region may have different structures in the first area R1 and the second area R2.

For example, in the first area R1, the fifth vertical level VL5, at which the bottom surface of the first trench Tr1 is located, is lower than the third vertical level VL3 at which the second damaged region starts. Therefore, only the first damaged region 300 may exist in the first region R1.

In the second area R2, the fifth vertical level VL5, at which the bottom surface of the second trench Tr2 is located, is higher than the fourth vertical level VL5 at which the second damaged region 1310 of the second area R2 starts. Therefore, not only the first damaged region 1300 of the second area R2 but also the second damaged region 1310 of the second area R2 may exist.

A method of fabricating a semiconductor device, according to exemplary embodiments of the present disclosure, will now be described with reference to FIGS. 1 and 5 through 19. To the extent that a detailed description of certain elements is not provided, it may be assumed that those elements are at least similar to corresponding elements that have already been described.

FIGS. 5 through 19 are views illustrating intermediate steps of a method of fabricating a semiconductor device according to exemplary embodiments of the present disclosure. For example, FIG. 16B is a view illustrating an intermediate step of the method of fabricating a semiconductor device, according to exemplary embodiments of the present disclosure, and FIG. 16C is a view illustrating an intermediate step of the method of fabricating a semiconductor device, according to exemplary embodiments of the present disclosure.

Figure 5:
FIGS. 5 through 19 are views illustrating intermediate steps of a method of fabricating a semiconductor device according to exemplary embodiments of the present disclosure.

First, referring to FIG. 5, a lower interlayer insulating film 100 is formed.

Other elements may be formed under the lower interlayer insulating film 100. The lower interlayer insulating film 100 may include silicon oxide, silicon nitride, silicon oxynitride, and/or a low dielectric constant material.

Figure 6:
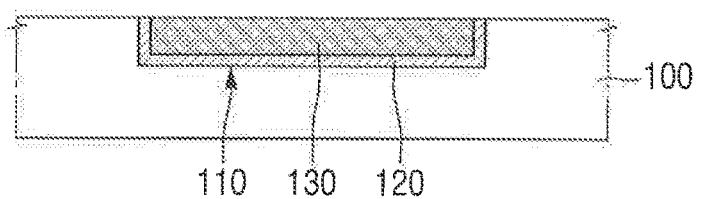

Next, referring to FIG. 6, a first lower trench 110, a first lower barrier pattern 120, and a first lower wiring pattern 130 are formed.

The first lower trench 110 may be formed by etching the lower interlayer insulating film 100. The first lower barrier pattern 120 may be formed along a bottom surface and side surfaces of the first lower trench 110. Although the first lower barrier pattern 120 is illustrated as a single layer, it can include a plurality of layers.

The first lower wiring pattern 130 may be formed on the first lower barrier pattern 120. The first lower wiring pattern 130 may completely fill the first lower trench 110.

Figure 7:
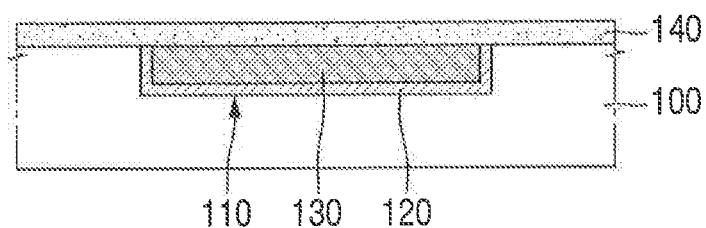

Next, referring to FIG. 7, a first etch stop layer 140 is formed.

The first etch stop layer 140 may be formed on exposed upper surfaces of the first lower barrier pattern 120 and the first lower wiring pattern 130. The first etch stop layer 140 may also be formed on an upper surface of the lower interlayer insulating film 100. However, the etch stop layer 140 may be alternatively formed. For example, the first etch stop layer 140 of a semiconductor device, according to exemplary embodiments of the present disclosure, may be formed only on the first lower barrier pattern 120 and the first lower wiring pattern 130.

The first etch stop layer 140 may include silicon nitride (SiN) and/or silicon carbonitride (SiCN). The first etch stop layer 140 may be formed using, for example, CVD or ALD.

Figure 8:
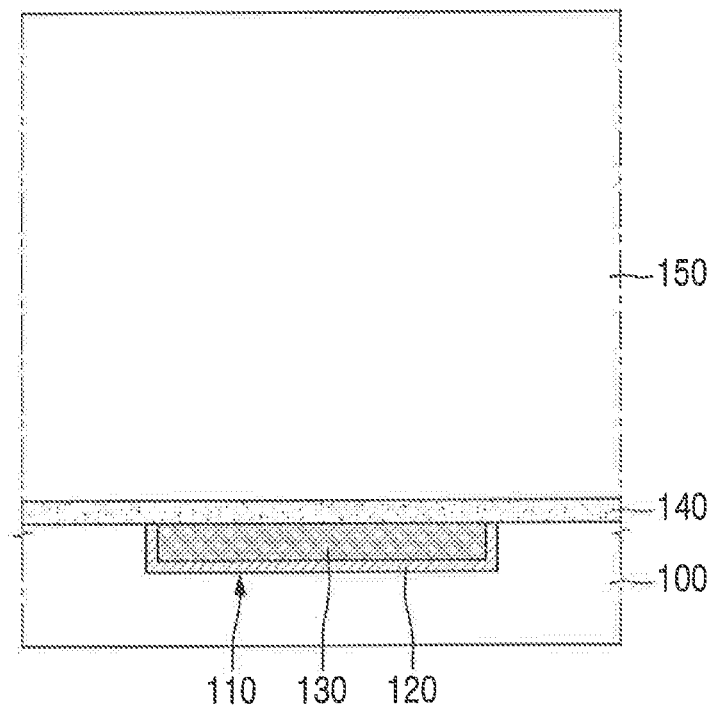

Next, referring to FIG. 8, an upper interlayer insulating film 150 is formed.

The upper interlayer insulating film 150 may be formed on the first etch stop layer 140. The upper interlayer insulating film 150 may directly contact an upper surface of the first etch stop layer 140.

The upper interlayer insulating film 150 may include silicon oxide, silicon nitride, silicon oxynitride, and/or a low dielectric constant material. The low dielectric constant material may be, for example, silicon oxide with moderately high carbon and hydrogen contents or may be a material such as SiCOH. Since carbon is contained in an insulating material, the dielectric constant of the insulating material is lowered.

The upper interlayer insulating film 150 may be formed using, for example, CVD, spin coating, PECVD, or HDP-CVD.

Figure 9:
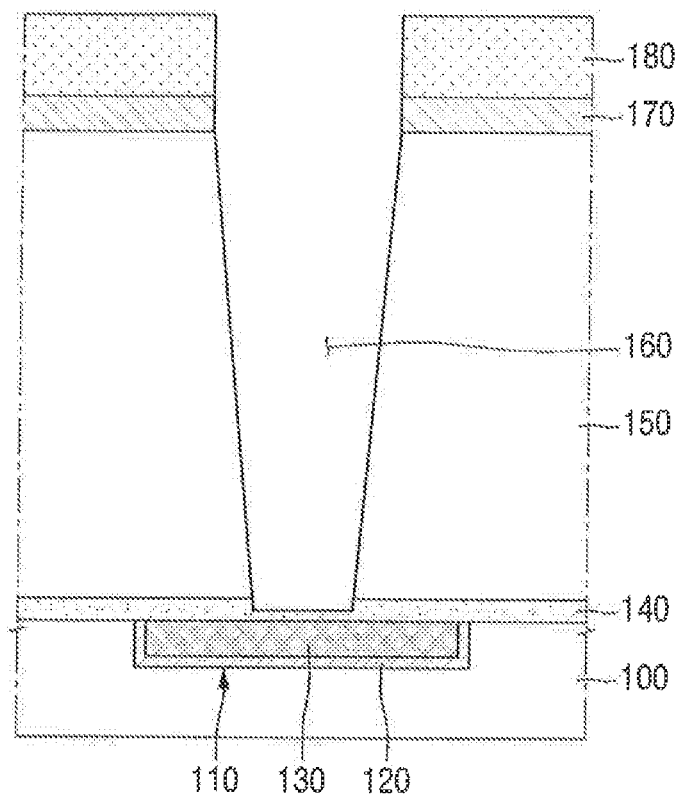

Next, referring to FIG. 9, a first via 160 is formed.

A first anti-reflection film 170 and a first photoresist 180 may be formed on the upper interlayer insulating film 150 before the first via 160 is formed. The first anti-reflection film 170 may be formed along an upper surface of the upper interlayer insulating film 150. The first photoresist 180 may be formed along an upper surface of the first anti-reflection film 170.

The first anti-reflection film 170 may be formed to prevent reflection in an exposure process. The first anti-reflection film 170 may include, but is not limited to including, a bottom anti-reflective coating (BARC).

The first photoresist 180 may serve as a mask in the exposure process. The first photoresist 180 may be a photosensitive film whose properties change when exposed to light.

The first photoresist 180 and the first anti-reflection film 170 may be patterned to form the first via 160. Accordingly, the upper surface of the upper interlayer insulating film 150 in a portion where the first via 160 is formed may be exposed.

Next, the first via 160 may be formed through an exposure process and an etching process. The first via 160 may be formed by etching the upper interlayer insulating film 150 and may be formed to extend in the vertical direction by anisotropic etching. The etching of the first via 160 may be stopped by the first etch stop layer 140. Accordingly, a portion of the first etch stop layer 140 may be removed while the other portion of the first etch stop layer 140 remains. Therefore, a bottom surface of the first via 160 may be the first etch stop layer 140.

Figure 10:
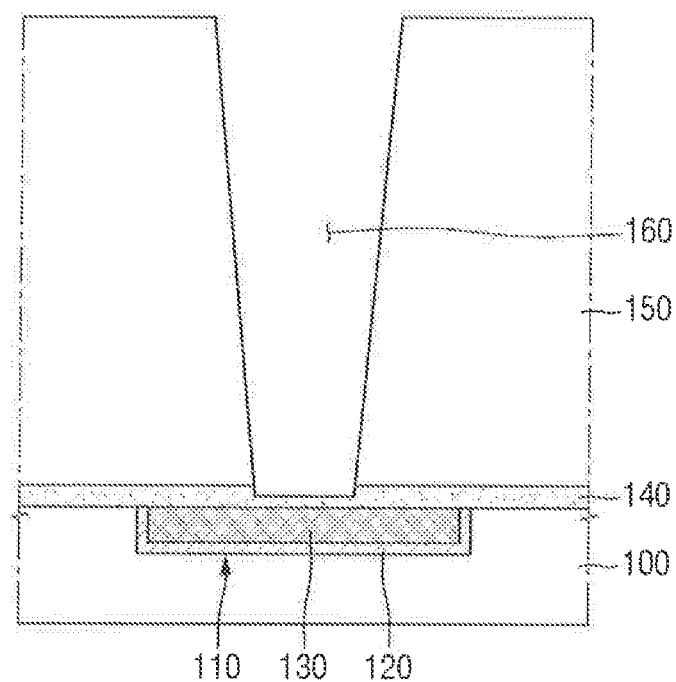

Next, referring to FIG. 10, the first anti-reflection film 170 and the first photoresist 180 may be removed.

Accordingly, the upper surface of the upper interlayer insulating film 150 may be exposed.

Figure 11:
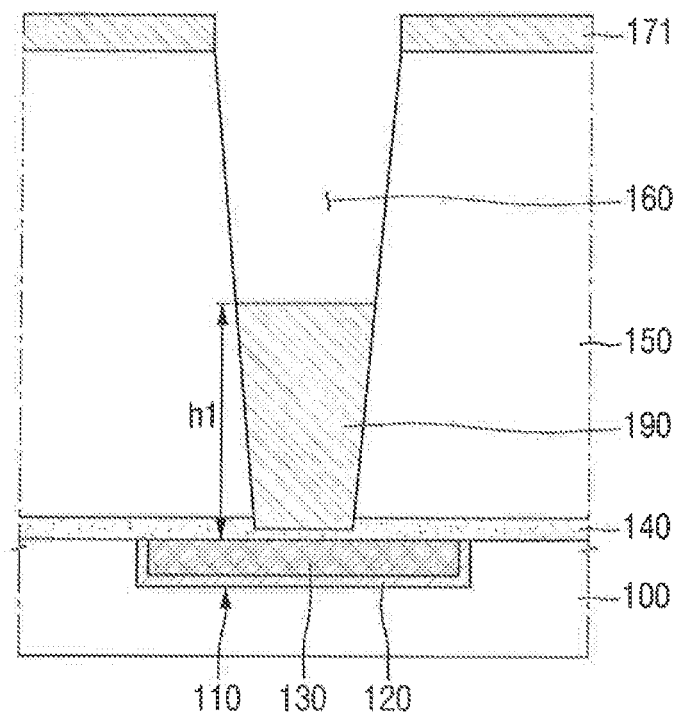

Next, referring to FIG. 11, a first filler 190 is formed.

The first filler 190 may be formed inside the first via 160. The first filler 190 may partially fill the first via 160. The first filler 190 may fill the first via 160 up to a first height h1.

A second anti-reflection film 171 may also be formed at the same time as the first filler 190. For example, the second anti-reflection film 171 and the first filler 190 may include the same material. For example, a film formed on the upper surface of the upper interlayer insulating film 150 outside the first via 160 may be the second anti-reflection film 171, and a film formed inside the first via 160 may be the first filler 190.

The first filler 190 and the second anti-reflection film 171 may each include, but are not limited to including, a BARC.

Figure 12:
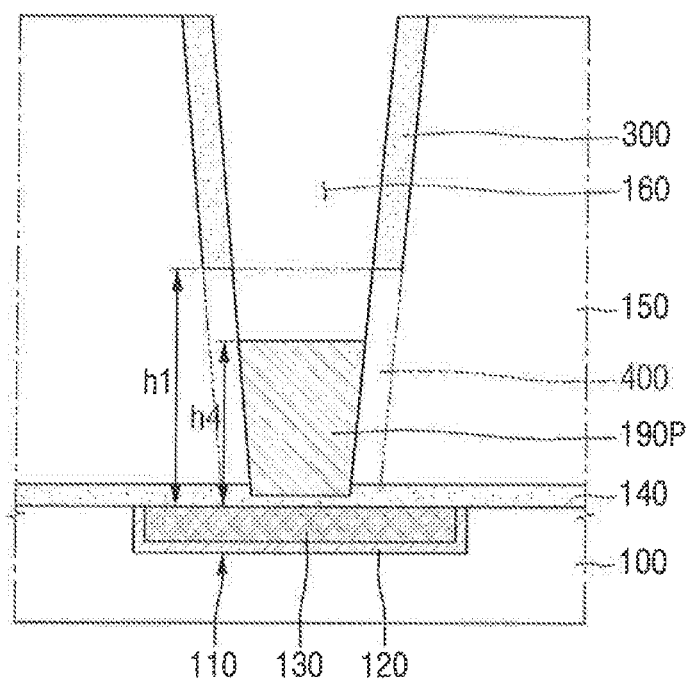

Next, referring to FIG. 12, a first filler pattern 190P is formed.

The second anti-reflection film 171 outside the first via 160 may be removed by an etch-back process. In addition, the first filler 190 inside the first via 160 may be partially etched to form the first filler pattern 190P.

The first filler pattern 190P may remain up to a fourth height h4. The fourth height h4 may be lower than the first height h1. For example, the first filler 190 formed up to the first height h1 may be partially etched by an etch-back process to become the first filler pattern 190P having the fourth height h4.

Sidewalls of the first via 160 may be damaged by the etch-back process. Therefore, a first damaged region 300 may be formed in an exposed portion above the first height h1. An undamaged region 400 may exist below the first damaged region 300. The undamaged region 400 may be an undamaged portion of a region adjacent to the sidewalls of the first via 160. For example, all portions of the upper interlayer insulating film 150 excluding the first damaged region 300 are not damaged, and a portion adjacent to the sidewalls of the first via 160 from among the portions is defined as the undamaged region 400.

The first damaged region 300 may have a lower carbon content than the undamaged region 400. This is because the carbon in the upper interlayer insulating film 150 flows out of the upper interlayer insulating film 150 due to damage.

Figure 13:
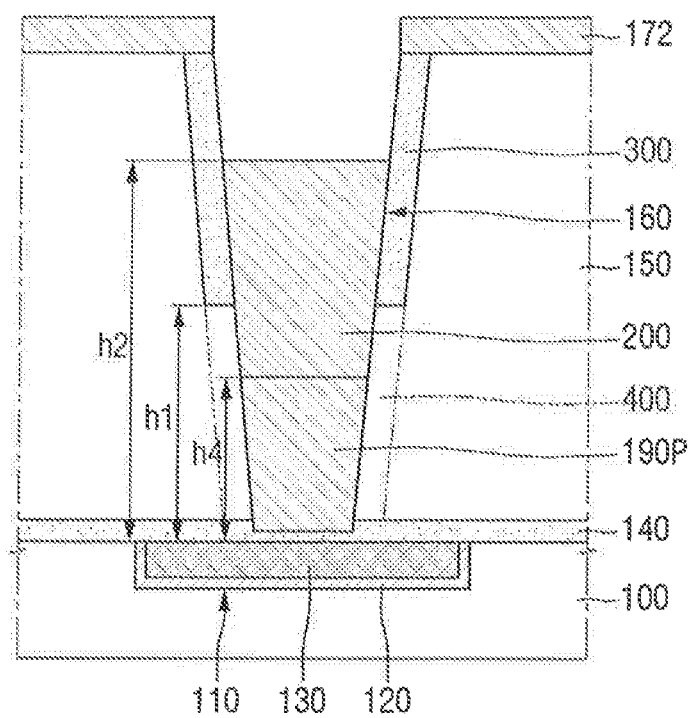

Next, referring to FIG. 13, a second filler 200 is formed.

The second filler 200 may be formed inside the first via 160. The second filler 200 may partially fill the first via 160. The second filler 200 may be formed on the first filler pattern 190P. The second filler 200 may fill the first via 160 between the fourth height h4 and a second height h2.

A third anti-reflection film 172 may also be formed at the same time as the second filler 200. For example, the third anti-reflection film 172 and the second filler 200 may include the same material. For example, a film formed on the upper surface of the upper interlayer insulating film 150 outside the first via 160 may be the third anti-reflection film 172, and a film formed inside the first via 160 may be the second filler 200. For example, the third anti-reflection film 172 and the second filler 200 may be formed simultaneously by the same process. The second filler 200 and the third anti-reflection film 172 may all include, but is not limited to including, a BARC.

Figure 14:
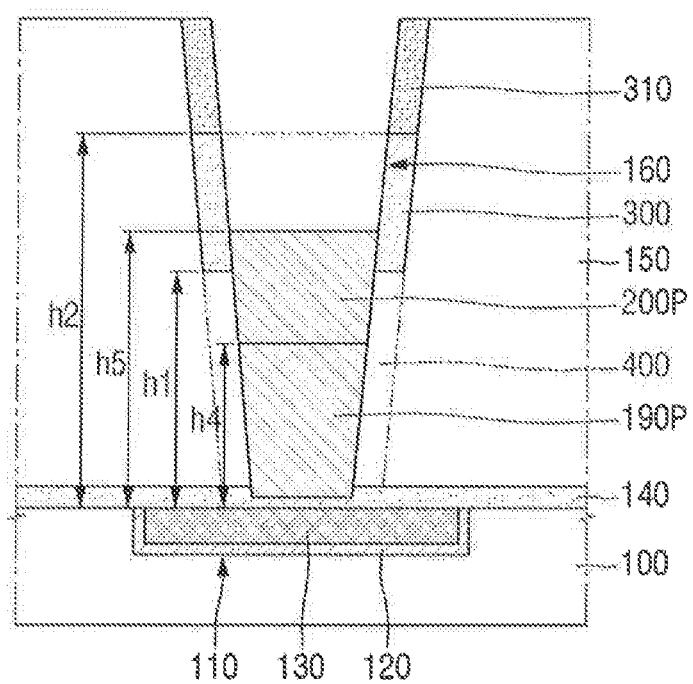

Next, referring to FIG. 14, a second filler pattern 200P is formed.

The third anti-reflection film 172 outside the first via 160 may be removed by an etch-back process. In addition, the second filler 200 inside the first via 160 may be partially etched to form the second filler pattern 200P.

The second filler pattern 200P may remain up to a fifth height h5. The fifth height h5 may be lower than the second height h2. For example, the second filler 200 formed up to the second height h2 may be partially etched by an etch-back process to become the second filler pattern 200P having the fifth height h5.

The exposed sidewalls of the first via 160 may be damaged again by the etch-back process. Therefore, a second damaged region 310 may be formed in an exposed portion above the second height h2. The second damaged region 310 may be an additionally damaged portion of the first damaged region 300.

The first damaged region 300 may exist below the second damaged region 310. The second damaged region 310 may have a lower carbon content than the first damaged region 300. This is because the carbon in the first damaged region 300 flows out of the first damaged region 300, to a greater extent, due to the additional damage.

Figure 15:
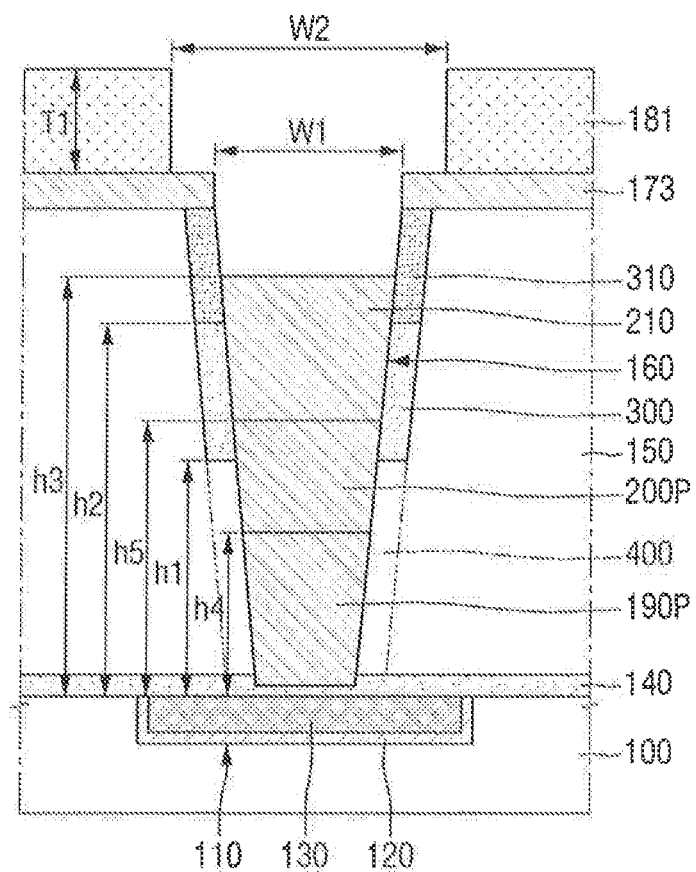

Next, referring to FIG. 15, a third filler 210 is formed.

The third filler 210 may be formed inside the first via 160. The third filler 210 may partially fill the first via 160. The third filler 210 may be formed on the second filler pattern 200P. The third filler 210 may fill the first via 160 between the fifth height h5 and a third height h3.

A fourth anti-reflection film 173 may also be formed at the same time as the third filler 210. For example, the fourth anti-reflection film 173 and the third fillers 210 may include the same material. For example, a film formed on the upper surface of the upper interlayer insulating film 150 outside the first via 160 may be the fourth anti-reflection film 173, and a film formed inside the first via 160 may be the third filler 210. For example, the fourth anti-reflection film 173 and the third filler 210 may be formed simultaneously by the same process. The third filler 210 and the fourth anti-reflection film 173 may all include, but is not limited to including, a BARC.

Since a portion of the fourth anti-reflection film 173 is formed as the third filler 210 due to the first via 160, portions of the fourth anti-reflection film 173 may be separated from each other by a first width W1.

Next, a second photoresist 181 may be formed on the fourth anti-reflection film 173. The second photoresist 181 may be patterned such that portions of the second photoresist 181 are separated from each other by a second width W2. Here, the second width W2 may be larger than the first width W1. A trench of the second width W2 may therefore be formed by using the second photoresist 181 as a mask. The second photoresist 181 may have a first thickness T1.

Referring to FIGS. 11 through 15, in the method of fabricating a semiconductor device, according to exemplary embodiments of the present disclosure, the process of forming a filler and forming a filler pattern through etch-back may be repeated to increase the height of the filler pattern. In FIGS. 11 through 15, the filler formation and etch-back process is repeated three times. However, the filler formation and etch-back process may be formed any number of times. For example, the filler formation and etch-back processes may be performed two or more times.

Due to other conditions such as the constraints of equipment and the thickness of an anti-reflection film, it is difficult to increase the height of the filler pattern through a single BARC formation process. Therefore, in the method of fabricating a semiconductor device, according to exemplary embodiments of the present disclosure, the height of the filler pattern may be increased through two or more filler formation and etch-back processes. The filler pattern thus formed can remain during the formation of a trench to be performed later, so that the first lower wiring pattern 130 is not damaged.

The filler formation and etch-back process may always be accompanied by the formation of an anti-reflection film. In the last filler formation and etch-back process, not only an anti-reflection film but also a photoresist may be formed as illustrated in FIG. 15. This approach simplifies the process by forming, in advance, a mask used to form a trench. Thus, the cost of the method of fabricating a semiconductor device, according to exemplary embodiments of the present disclosure, can be minimized.

Figure 16A:
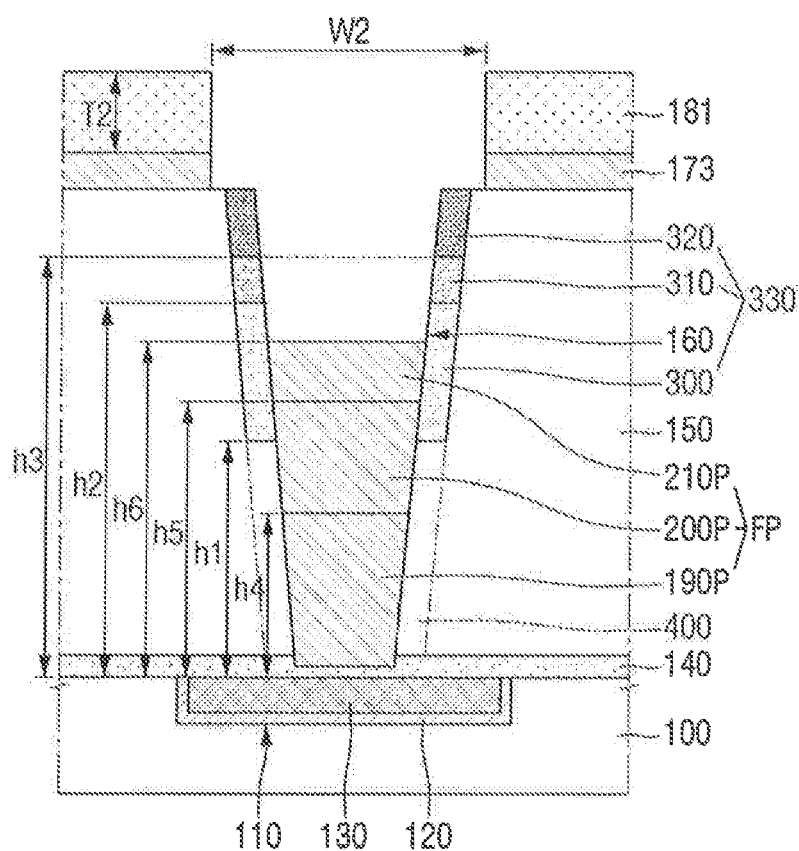
Figure 16B:
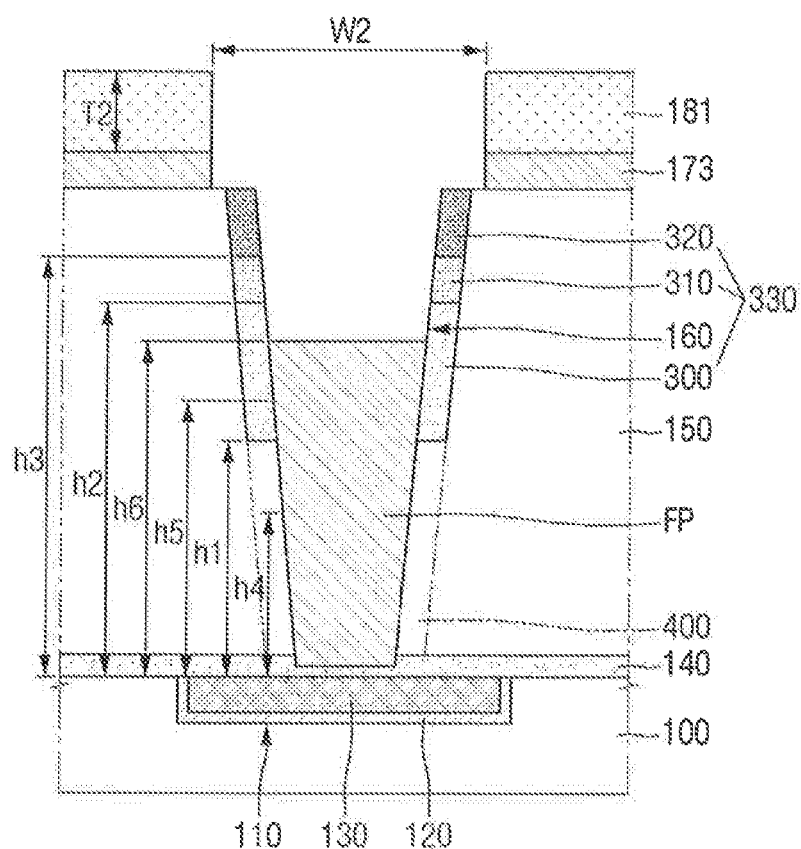
Figure 16C:
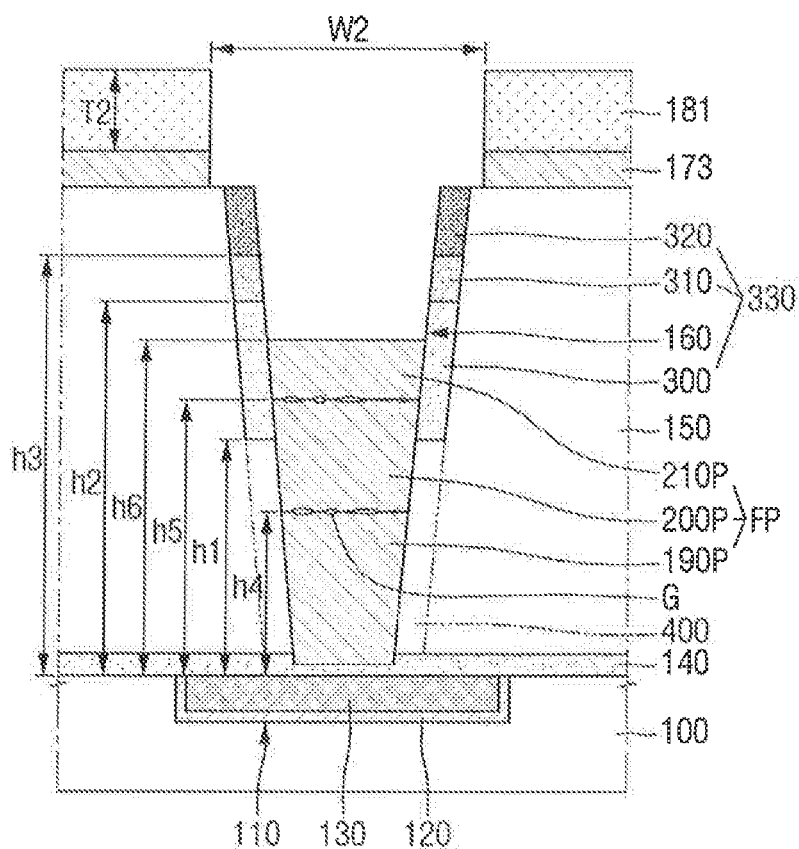

Referring to FIG. 16a, a third filler pattern 210P is formed.

An exposed portion of the fourth anti-reflection film 173 outside the first via 160 may be removed by an etch-back process. However, a portion of the fourth anti-reflection film 173 which is covered by the second photoresist 181 might not be removed. In addition, the third filler 210 inside the first via 160 may be partially etched to form the third filler pattern 210P.

The third filler pattern 210P may remain up to a sixth height h6. The sixth height h6 may be lower than the third height h3. For example, the third filler 210 formed up to the third height h3 may be partially etched by an etch-back process to become the third filler pattern 210P having the sixth height h6.

The exposed sidewalls of the first via 160 may be damaged again by the etch-back process. Therefore, a third damaged region 320 may be formed in an exposed portion above the third height h3. The third damaged region 320 may be an additionally damaged portion of the second damaged region 310.

The second damaged region 310 may exist below the third damaged region 320. The third damaged region 320 may have a lower carbon content than the second damaged region 310. This is because the carbon in the second damaged region 310 flows out of the second damaged region 310, to a greater extent, due to the additional damage.

The second photoresist 181 is not removed by the etch-back process, but a portion of the second photoresist 181 may be removed. Accordingly, the thickness of the second photoresist 181 may be reduced from the first thickness T1 to a second thickness T2.

The first filler pattern 190P, the second filler pattern 200P, and the third filler pattern 210P may be included in a filler pattern FP. The first filler pattern 190P, the second filler pattern 200P, and the third filler pattern 210P may all include the same material.

The first damaged region 300, the second damaged region 310, and the third damaged region 320 may be included in a damaged region 330. The damaged region 330 may have a lower carbon content than the undamaged region 400.

Referring to FIG. 16b, a semiconductor device, according to exemplary embodiments of the present disclosure, may include an integrated filler pattern FP.

For example, since the first filler pattern 190P, the second filler pattern 200P and the third filler pattern 210P in FIG. 16a may include the same material, the interfaces between the first filler pattern 190P, the second filler pattern 200P and the third filler pattern 210P might not be distinguished. Therefore, the process of forming the second filler pattern 200P on the first filler pattern 190P and forming the third filler pattern 210P on the second filler pattern 200P can be seen as a process of increasing the height of the filler pattern FP.

Alternatively, referring to FIG. 16c, pores G may be formed at the interfaces between the first filler pattern 190P, the second filler pattern 200P and the third filler pattern 210P. The pores G may be formed between the first filler pattern 190P and the second filler pattern 200P and between the second filler pattern 200P and the third filler pattern 210P. The pores G may result from the unsmooth surfaces of the first filler pattern 190P, the second filler pattern 200P, and the third filler pattern 210P.

Figure 17:
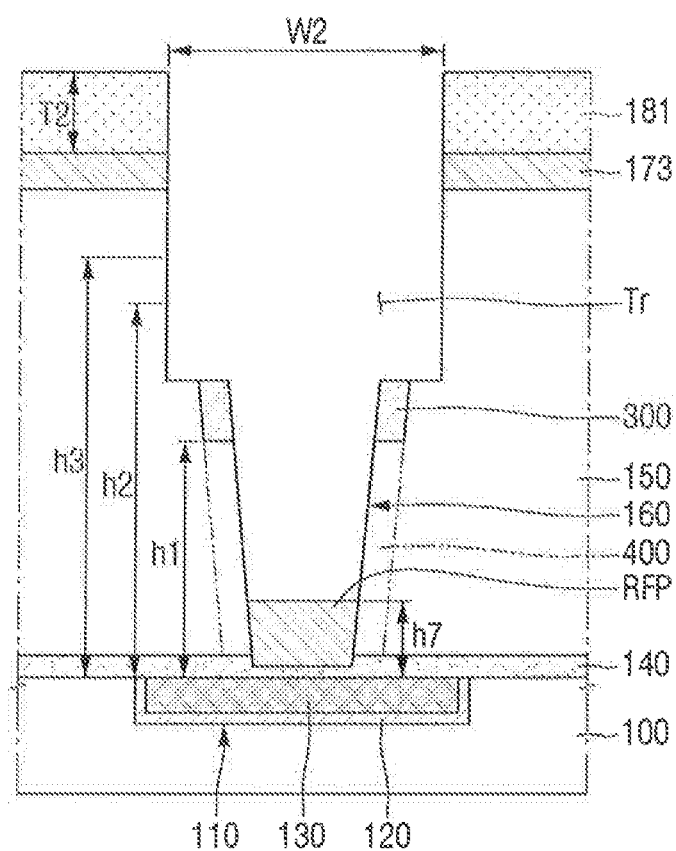

Next, referring to FIG. 17, a trench Tr is formed.

The trench Tr may be formed by etching the upper interlayer insulating film 150 using the second photoresist 181 and the fourth anti-reflection film 173 as a mask. The trench Tr may be formed to a depth between the first height h1 and the second height h2. Accordingly, the second damaged region 310 and the third damaged region 320 of the damaged region 330 in FIG. 16a may be removed, and only the first damaged region 300 may be left.

Since the trench Tr is formed using the second photoresist 181 as a mask, it may have the second width W2. Accordingly, the trench Tr may be wider than the first via 160. A portion of a bottom surface of the trench Tr may be formed flat on the first via 160.

While the trench Tr is being etched, the filler pattern FP of FIG. 16a may be etched to become a residual filler pattern RFP. The residual filler pattern RFP may remain only up to a seventh height h7. Due to the residual filler pattern RFP, the first lower wiring pattern 130 might not be damaged in the etching process of the trench Tr. If the height of the filler pattern FP of FIG. 16a is not sufficient, the first lower wiring pattern 130 may be damaged by the etching process of the trench Tr although the first etch stop layer 140 remains.

Accordingly, the reliability of a semiconductor device fabricated by a method of fabricating a semiconductor device may be reduced. To prevent this problem, in the method of fabricating a semiconductor device according to exemplary embodiments of the present disclosure, the filler pattern FP of FIG. 16a may be formed high so that the residual filler pattern RFP exists in the etching process of the trench Tr. Therefore, damage to the first lower wiring pattern 130 can be prevented, thereby increasing the reliability of a semiconductor device.

Figure 18:
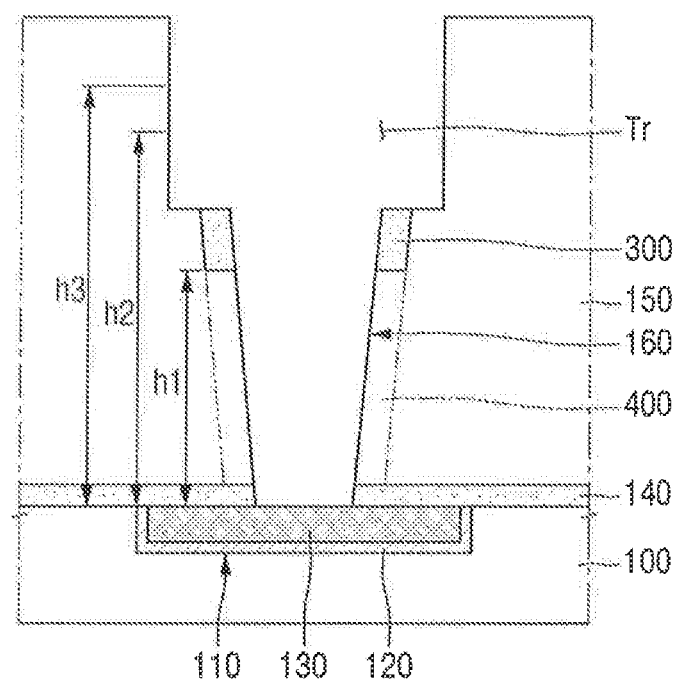

Next, referring to FIG. 18, the second photoresist 181, the fourth anti-reflection film 173, and the residual filler pattern RFP are removed.

In addition, a portion of the first etch stop layer 140 is partially removed. The removed portion of the first etch stop layer 140 may be a portion that forms the bottom surface of the first via 160. Accordingly, the upper surface of the first lower wiring pattern 130 may be exposed by the first via 160.

Figure 19:
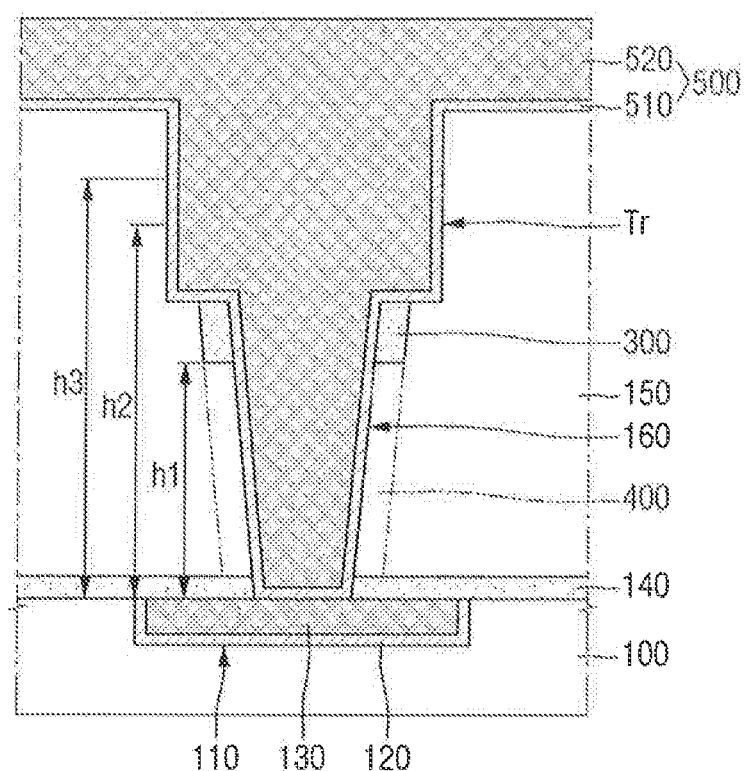

Referring to FIG. 19, a wiring structure film 500 is formed.

The wiring structure film 500 may fill both the trench Tr and the first via 160. The wiring structure film 500 may directly contact the first lower wiring pattern 130. The wiring structure film 500 may be electrically connected to the first lower wiring pattern 130.

The wiring structure film 500 may include a barrier film 510 and a wiring film 520. The barrier film 510 may be formed along the bottom surface and sidewalls of the first via 160. The barrier film 510 may also be formed along the bottom surface and sidewalls of the trench Tr. Further, the barrier film 510 may be formed along the upper surface of the upper interlayer insulating film 150.

The barrier film 510 may include, for example, tantalum (Ta), tantalum nitride (TaN), titanium (Ti), titanium nitride (TiN), ruthenium (Ru), cobalt (Co), nickel (Ni), nickel boron (NiB), tungsten nitride (WN), zirconium (Zr), zirconium nitride (ZrN), vanadium (V), vanadium nitride (VN), niobium (Nb), and/or niobium nitride (NbN).

Although the barrier film 510 is illustrated as a single layer, it can include a plurality of layers.

The wiring film 520 may be formed on the barrier film 510. The wiring film 520 may completely fill the first via 160 and the trench Tr. Further, the wiring film 520 may also be formed on the upper interlayer insulating film 150. The wiring film 520 may include, for example, aluminum (Al), copper (Cu), tungsten (W), and/or cobalt (Co).

Next, referring to FIG. 1, a first wiring structure 500P is formed.

The wiring structure film 500 of FIG. 19 may be changed into the first wiring structure 500P by chemical mechanical polishing (CMP). An upper surface of the first wiring structure 500P may lie in the same plane as the upper surface of the upper interlayer insulating film 150.

The first wiring structure 500P may include a first upper barrier pattern 510P and a first upper wiring pattern 520P. The first upper barrier pattern 510P may be formed along the bottom surface and sidewalls of the first via 160. In addition, the first upper barrier pattern 510P may be formed along the bottom surface and sidewalls of the trench Tr. For example, the first upper barrier pattern 510P may be formed along inner walls of the trench Tr and the first via 160.

The first upper wiring pattern 520P may be formed on the first upper barrier pattern 510P. The first upper wiring pattern 520P may completely fill the first via 160 and the trench Tr. Therefore, the first via 160 and the trench Tr may be completely filled with the first upper barrier pattern 510P and the first upper wiring pattern 520P.

A method of fabricating a semiconductor device, according to exemplary embodiments of the present disclosure, will now be described with reference to FIGS. 4 and 20 through 25. To the extent that a detailed description of certain elements is not provided, it may be assumed that those elements are at least similar to corresponding elements that have already been described.

FIGS. 20 through 25 are views illustrating intermediate steps of a method of fabricating a semiconductor device, according to exemplary embodiments of the present disclosure.

Figure 20:
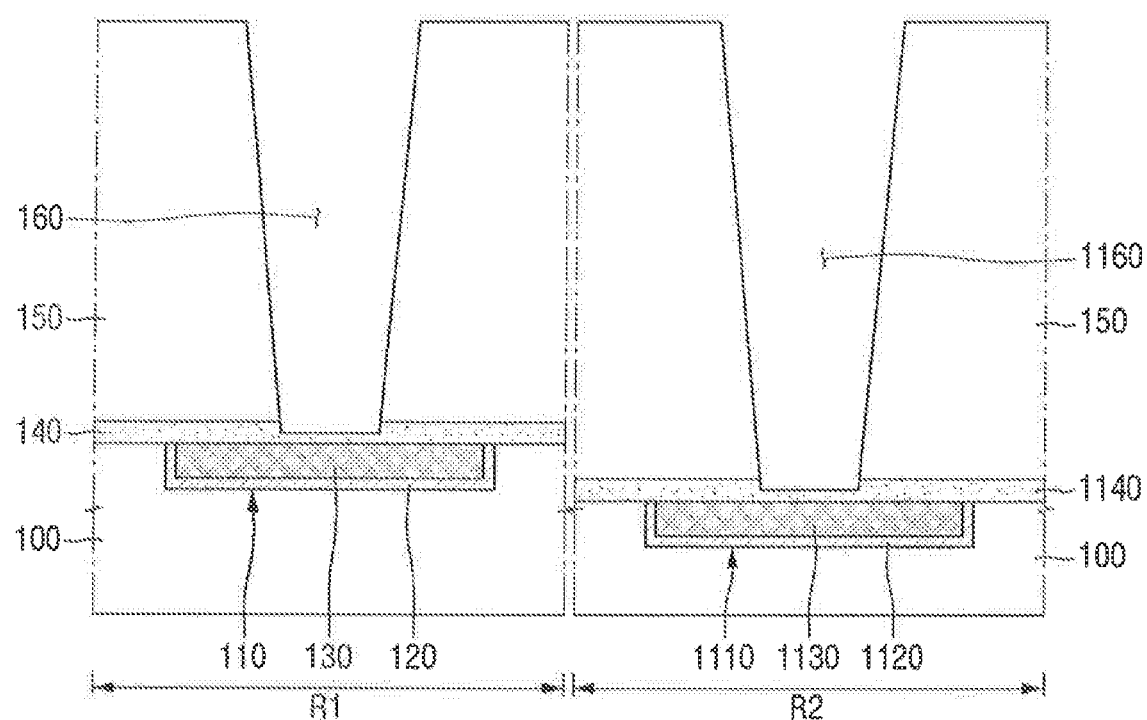
FIGS. 20 through 25 are cross-sectional views illustrating intermediate steps of a method of fabricating a semiconductor device according to exemplary embodiments of the present disclosure.

First, referring to FIG. 20, a first via 160 and a second via 1160 are formed.

An upper interlayer insulating film 150 may have structures of different depths in a first area R1 and a second area R2, respectively. For example, a first lower barrier pattern 120 and a first lower wiring pattern 130 may be formed in a first lower trench 110 in the first area R1. A first etch stop layer 140 may be formed on the first lower barrier pattern 120 and the first lower wiring pattern 130.

A second lower barrier pattern 1120 and a second lower wiring pattern 1130 may be formed in a second lower trench 1110 in the second area R2. A second etch stop layer 1140 is formed on the second lower barrier pattern 1120 and the second lower wiring pattern 1130.

The first lower wiring pattern 130 and the second lower wiring pattern 1130 may be disposed at different heights. For example, the first lower wiring pattern 130 may be formed higher than the second lower wiring pattern 1130.

The upper interlayer insulating film 150 may be formed in the first area R1 and the second area R2.

The first via 160 may be formed by etching the upper interlayer insulating film 150 and a portion of the first etch stop layer 140 in the first area R1. The second via 1160 may be formed by etching the upper interlayer insulating film 150 and a portion of the second etch stop layer 1140 in the second area R2. The second via 1160 may be formed deeper than the first via 160.

Figure 21:
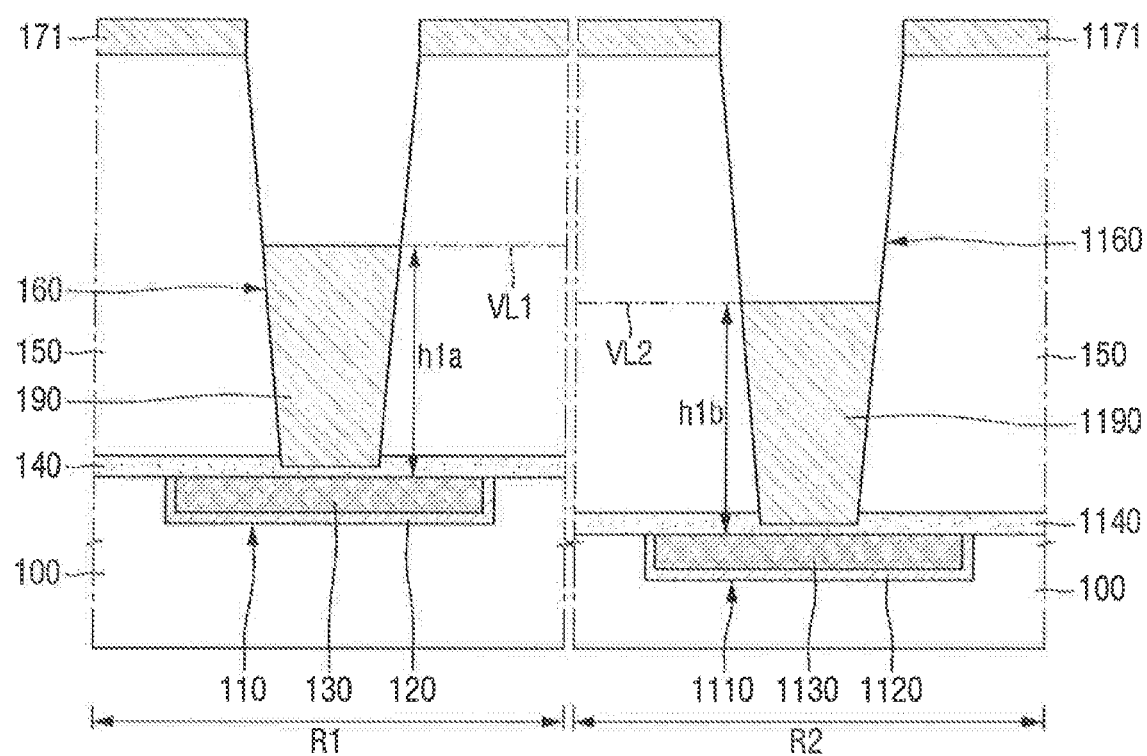

Next, referring to FIG. 21, a first filler 190 of the first area R1 and a first filler 1190 of the second area R2 are formed.

The first filler 190 may be formed in the first via 160 up to a first height h1a of the first area R1. Here, the first height h1a of the first area R1 may be defined as a first vertical level VL1. The first filler 1190 may be formed in the second via 1160 up to a first height h1b of the second area R2. Here, the first height b1b of the second area R2 may be defined as a second vertical level VL2. The second vertical level VL2 may be lower than the first vertical level VL1.

In addition, a second anti-reflection film 171 of the first area R1 and a second anti-reflection film 1171 of the second area R2 may be formed on an upper surface of the upper interlayer insulating film 150. The second anti-reflection film 171 of the first area R1 and the second anti-reflection film 1171 of the second area R2 may include the same material as the first filler 190 and the first filler 1190.

Figure 22:
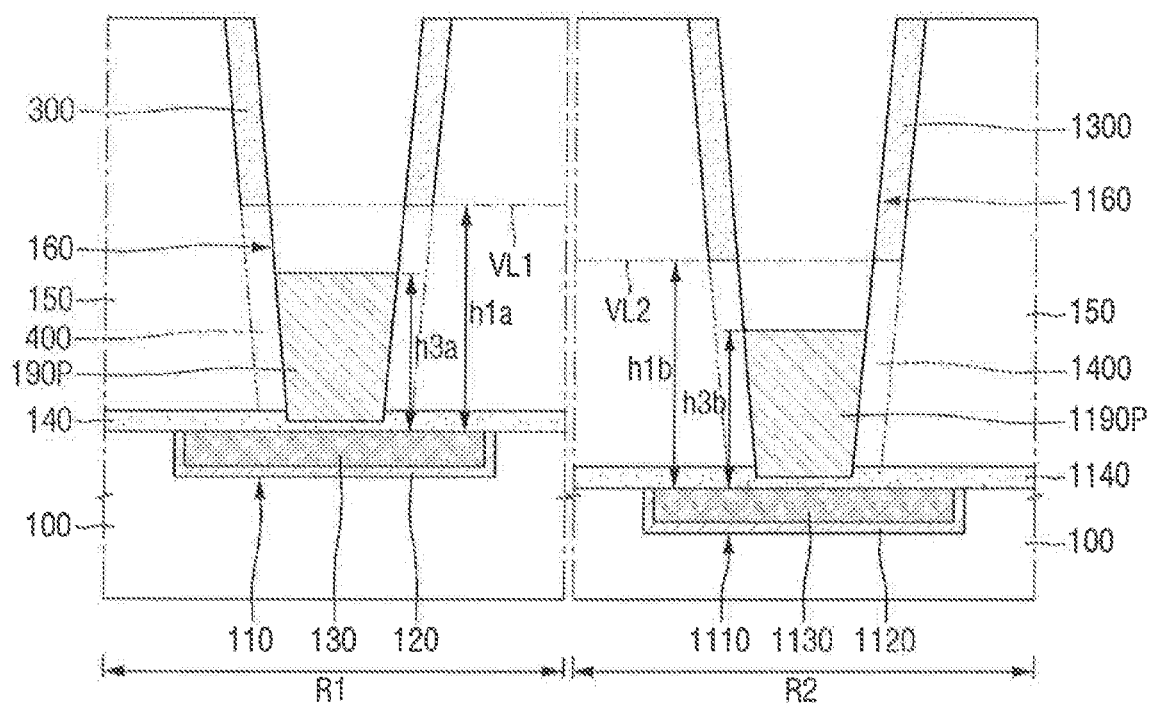

Next, referring to FIG. 22, a first filler pattern 190P of the first area R1 and a first filler pattern 1190P of the second area R2 are formed by an etch-back process.

The first filler pattern 190P of the first area R1 may remain up to a third height h3a of the first area R1. The first filler pattern 1190P of the second area R2 may remain up to a third height h3b of the second area R2. Due to the etch-back process, sidewalls of the first via 160 may include a first damaged region 300, and sidewalls of the second via 1160 may include a first damaged region 1300 of the second area R2. In addition, the sidewalls of the first via 160 may include an undamaged region 400 of the first area R1, and the sidewalls of the second via 1160 may include an undamaged region 1400 of the second area R2.

The first damaged region 300 of the first area R1 and the first damaged region 1300 of the second area R2 may have a lower carbon content than the undamaged region 400 of the first area R1 and the undamaged region 1400 of the second area R2, respectively.

Figure 23:
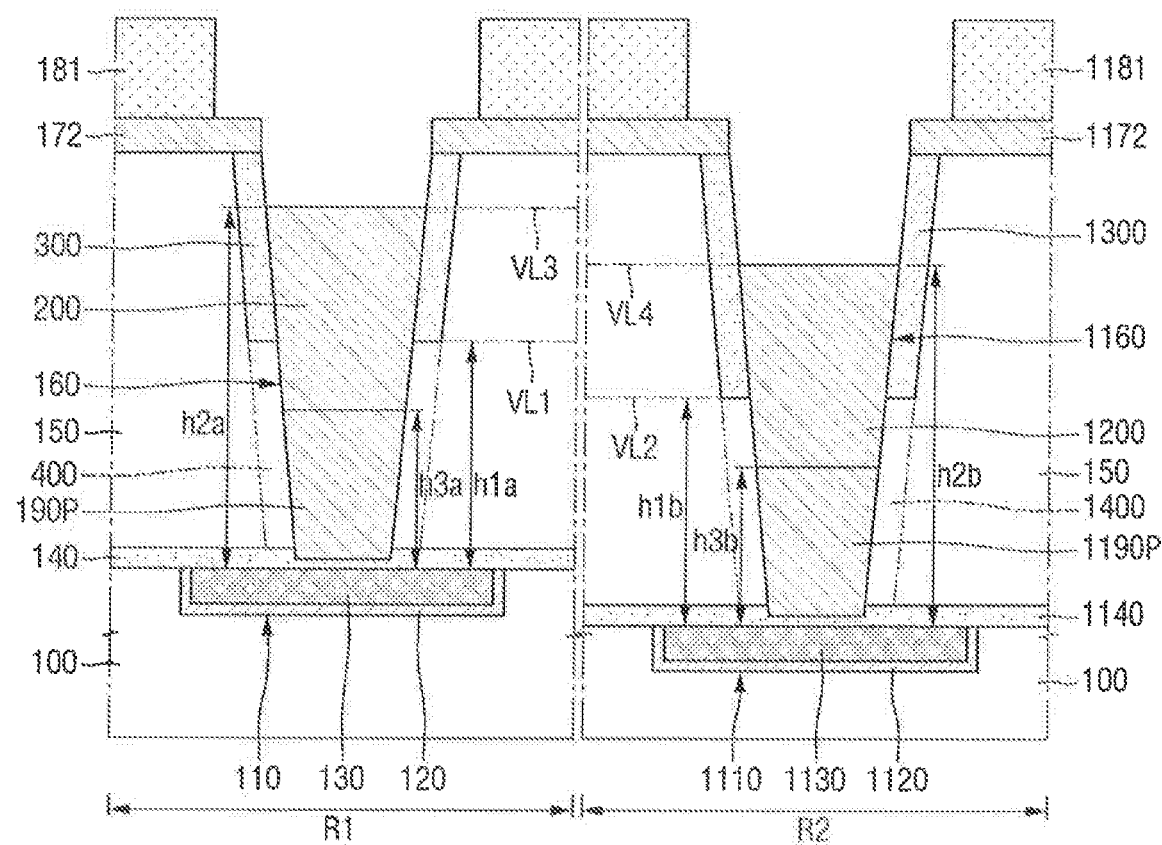

Next, referring to FIG. 23, a second filler 200 of the first area R1 and a second filler 1200 of the second area R2 are formed.

The second filler 200 of the first area R1 may be formed to a second height h2a of the first area R1, and the second filler 1200 of the second area R2 may be formed to a second height h2b of the second area R2. The second height h2a of the first area R1 may be expressed as a third vertical level VL3, and the second height h2b of the second area R2 may be expressed as a fourth vertical level VL4.

Here, a third anti-reflection film 172 of the first area R1 and a third anti-reflection film 1172 of the second area R2 may also be formed. In addition, a second photoresist 181 of the first area R1 and a second photoresist 1181 of the second area R2 may be formed.

Figure 24:
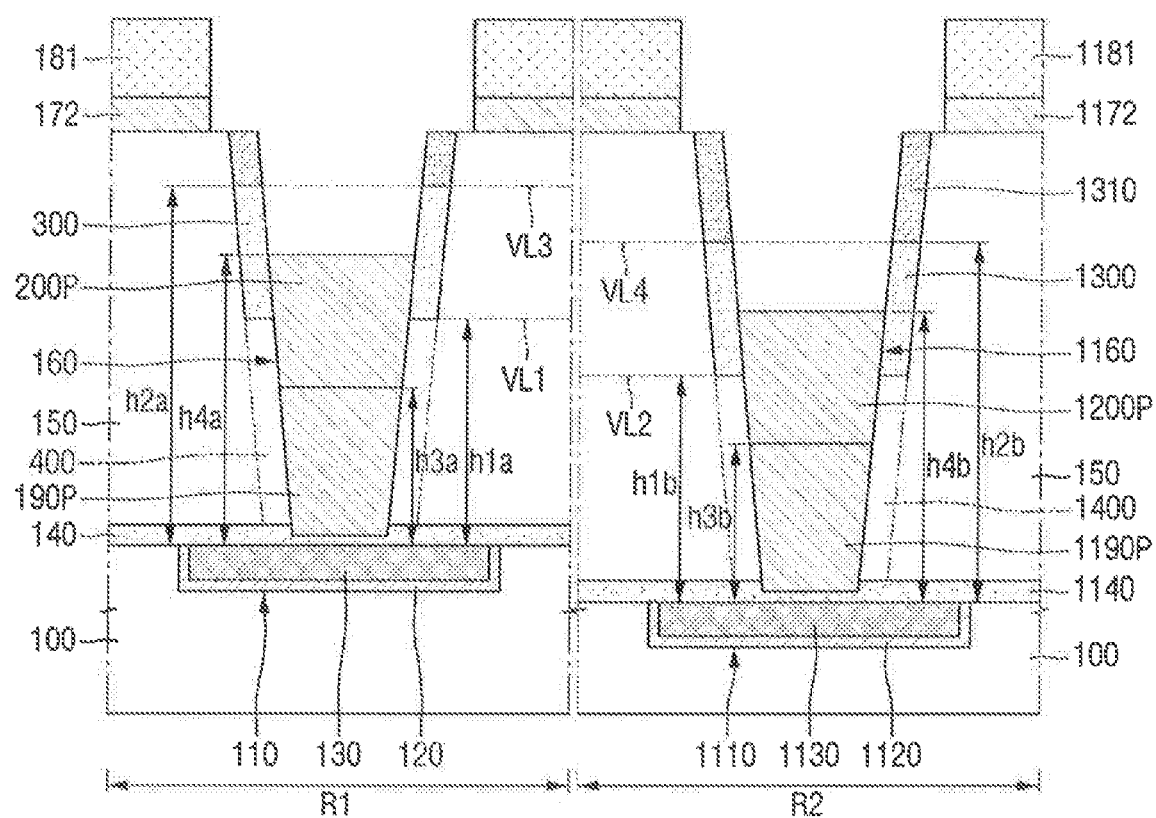

Next, referring to FIG. 24, a second filler pattern 200P of the first area R1 and a second filler pattern 1200P of the second area R2 are formed by an etch-back process.

The second filler pattern 200P of the first area R1 may remain up to a fourth height h4a of the first area R1. The second filler pattern 1200P of the second area R2 may remain up to a fourth height h4b of the second area R2. Due to the etch-back process, the sidewalls of the first via 160 may include a second damaged region 310, and the sidewalls of the second via 1160 may include a second damaged region 1310 of the second area R2.

The second damaged region 310 of the first area R1 and the second damaged region 1310 of the second area R2 may have a lower carbon content than the first damaged region 300 of the first area R1 and the first damaged region 1300 of the second area R2, respectively.

Figure 25:
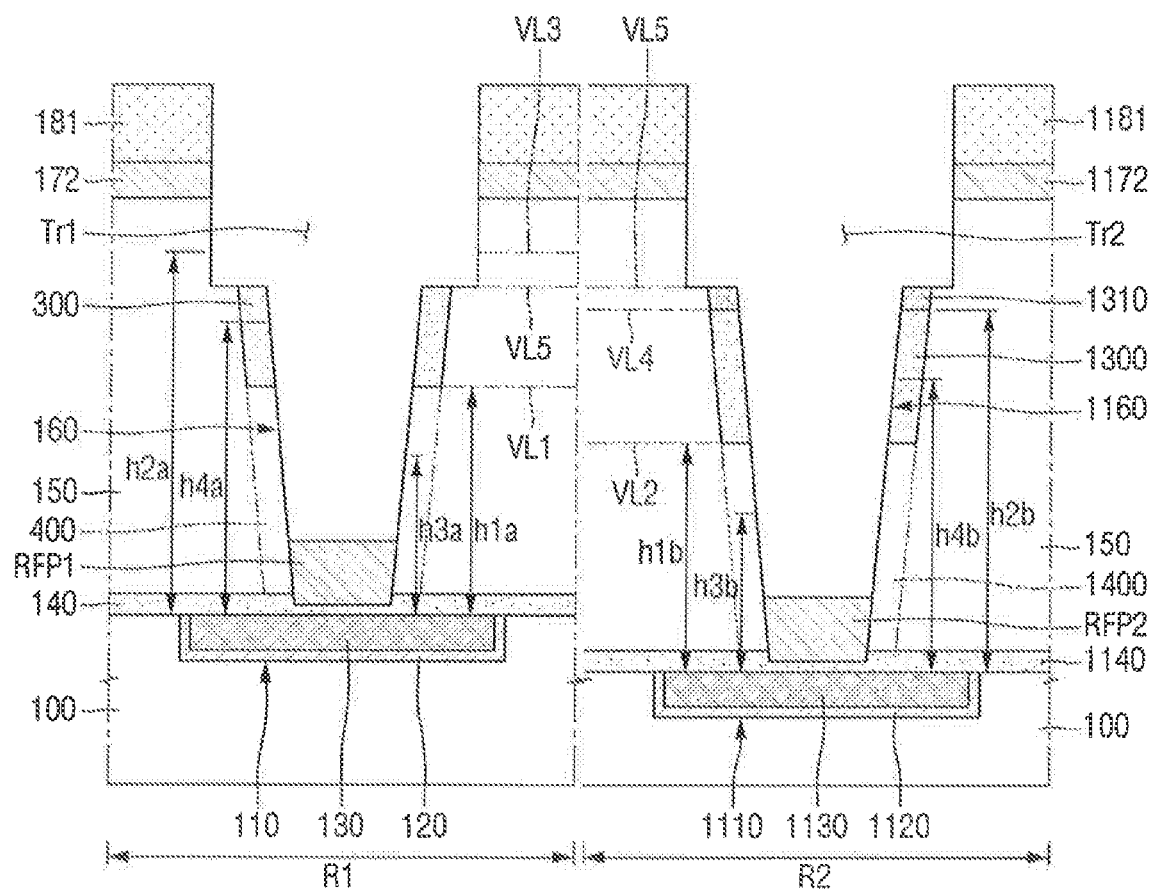

Next, referring to FIG. 25, a first trench Tr1 and a second trench Tr2 are formed.

The first trench Tr1 may be formed by using the second photoresist 181 of the first area R1 as a mask, and the second trench Tr2 may be formed by using the second photoresist 1181 of the second area R2 as a mask. Bottom surfaces of the first trench Tr1 and the second trench Tr2 may be expressed as a fifth vertical level VL5. For example, the first trench Tr1 and the second trench Tr2 may be formed at the same vertical level.

The fifth vertical level VL5 may be lower than the third vertical level VL3 and higher than the fourth vertical level VL4. Accordingly, the second damaged region 310 of the first area R1 may be removed, but a portion of the second damaged region 1310 of the second area R2 may remain. This may be because the elements of the first area R1 and the second area R2 have different depths.

A first residual filler pattern RFP1 and a second residual filler pattern RFP2 may be formed as the first trench Tr1 and the second trench Tr2 are formed. Due to the presence of the first residual filler pattern RFP1 and the second residual filler pattern RFP2, the first lower wiring pattern 130 and the second lower wiring pattern might not be damaged.

Next, referring to FIG. 4, a first wiring structure 500P and a second wiring structure 1500P are formed.

First, the first and second residual filler patterns RFP1 and RFP2 are removed, and the first etch stop layer 140 and the second etch stop layer 1140 are removed to expose upper surfaces of the first lower wiring pattern 130 and the second lower wiring pattern 1130.

Then, the first wiring structure 500P may be electrically connected to the first lower wiring pattern 130 in the first area R1. The first wiring structure 500P may completely fill the first via 160 and the first trench Tr1.

The first wiring structure 500P may include a first upper barrier pattern 510P and a first upper wiring pattern 520P. The first upper barrier pattern 510P may be formed along inner walls of the first via 160 and the first trench Tr1, and the first upper wiring pattern 520P may be formed on the first upper barrier pattern 510P.

In the second area R2, the second wiring structure 1500P may be electrically connected to the second lower wiring pattern 1130. The second wiring structure 1500P may completely fill the second via 1160 and the second trench Tr2.

The second wiring structure 1500P may include a second upper barrier pattern 1510P and a second upper wiring pattern 1520P. The second upper barrier pattern 1510P may be formed along inner walls of the second via 1160 and the second trench Tr2, and the second upper wiring pattern 1520P may be formed on the second upper barrier pattern 1510P.

What is claimed is:

1. A method of fabricating a semiconductor device, the method comprising:
   forming a lower wiring;
   forming an etch stop layer on the lower wiring;
   forming an interlayer insulating film covering the lower wiring and the etch stop layer;
   forming a via in the interlayer insulating film, the via exposing an upper surface of the etch stop layer;
   forming a first filler in the via, the first filler partially filling the via;
   etching the first filler to form a first filler pattern;
   forming a second filler on the first filler pattern within the via, the first filler pattern and the second filler, together, partially filling the via;
   etching the second filler to form a second filler pattern;
   etching the interlayer insulating film to form a trench;
   etching the first and second filler patterns, during the forming of the trench, to form a residual filler pattern;
   removing the residual filler pattern and the etch stop layer; and
   forming a wiring structure within the via and the trench, the wiring structure being electrically connected to the lower wiring,
   wherein the via comprises a lower portion and an upper portion disposed on the lower portion, and
   wherein the trench comprises the upper portion of the via.

2. The method of claim 1, wherein the first and second fillers comprise a same material.

3. The method of claim 2, wherein the first and second fillers each comprise a bottom anti-reflective coating (BARC).

4. The method of claim 1, wherein the via comprises a first portion filled with the first filler and a second portion not filled with the first filler, and a first damaged region is formed in the interlayer insulating film along sidewalls of the second portion when the first filler is etched.

5. The method of claim 4, wherein the interlayer insulating film comprises the first damaged region aid a first undamaged region which is in contact with the first damaged region, wherein a carbon content of the first damaged region is lower than that of the first undamaged region.

6. The method of claim 1, wherein the forming of the first filler comprises forming a first anti-reflection film on the interlayer insulating film at the same time as forming the first filler.

7. The method of claim 6, wherein the forming of the second filler comprises forming a second anti-reflection film on the interlayer insulating film at the same time as forming the second filler.

8. The method of claim 7, further comprising forming a photoresist on the second anti-reflection film.

9. The method of claim 8, further comprising forming a photoresist pattern by patterning the photoresist.

10. The method of claim 9, wherein the photoresist pattern exposes a portion of an upper surface of the second anti-reflection film.

11. A method of fabricating a semiconductor device, the method comprising:
    forming a lower wiring;
    forming an etch stop layer on the lower wiring;
    forming an interlayer insulating film covering the lower wiring and the etch stop layer;
    forming a via in the interlayer insulating film, the via exposing an upper surface of the etch stop layer;
    forming a first filler in the via;
    etching the first filler to form a first filler pattern;
    forming a second filler on the first filler pattern within the via;
    etching the second filler to form a second filler pattern;
    forming a third filler on the second filler pattern within the via;
    etching the third filler to form a third filler pattern;
    etching the interlayer insulating film to form a trench;

etching the first, second and third filler patterns, during the forming of the trench, to form a residual filler pattern;
removing the residual filler pattern and the etch stop layer; and
forming a wiring structure within the via and the trench, the wiring structurre being electrically connected to the lower wiring,
wherein the via comprises a lower portion and an upper portion disposed on the lower portion, and
wherein the trench comprises the upper portion of the via.

12. A method fabricating a semiconductor device, the method comprising:
forming a lower wiring;
forming an etch stop layer on the lower wiring;
forming an interlayer insulating film coveting the lower wiring and the etch stop layer;
forming a via in the interlayer insulating film, the via exposing an upper surface of the etch stop layer;
forming a first filler in the via;
etching the first filler to form a first filler pattern;
forming a second filler on the first filler pattern within the via;
etching the second filler to form a second filler pattern;
etching the interlayer insulating film to form a trench;
etching the first and second filler patterns, during the forming of the trench, to form a residual filler pattern;
removing the residual filler pattern and the etch stop layer; and
forming a wiring structure within the via and the trench, the wiring structure being electrically connected to the lower wiring,
wherein the via comprises a lower portion and an upper portion disposed on the lower portion,
wherein the trench comprises the upper portion of the via,
wherein the via comprises a first portion filled with the first filler and a second portion not filled with the first filler, and a first damaged region is formed in the interlayer insulating film along sidewalls of the second portion when the first filler is etched, and
wherein the via comprises a third portion filled with the second filler and a fourth portion not filled with the second filler, the third portion is a part of the first portion, and a second damaged region is formed in the interlayer insulating film along sidewalls of the fourth portion when the second filler is etched.

13. The method of claim 12, further comprising:
forming a third filler on the second filler pattern within the via; and
etching the third filler to form a third filler pattern,
wherein the first through third filler patterns are etched to form the residual filler pattern.

14. The method of claim 12, wherein the first and second fillers comprise a same material.

15. The method of claim 14, wherein the first and second fillers each corm rise a bottom anti-reflective coating (BARC).

16. The method of claim 12, wherein a carbon content of the second damaged region is lower than that of the first damaged region.

17. The method of claim 12, Wherein the interlayer insulating film comprises the first damaged region and a first undamaged region which is in contact with the first damaged region, wherein a carbon content of the first damaged region is lower than that of the first undamaged region.

18. The method of claim 12, wherein the forming of the first filler comprises forming a first anti-reflection film on the interlayer insulating film at the same time as forming the first filler.

19. The method of claim 18, wherein the forming of the second filler comprises forming a second anti-reflection film on the interlayer insulating film at the same time as forming the second filler.

20. The method of claim 19, further comprising:
forming a photoresist on the second anti-reflection film; and
forming a photoresist pattern by patterning the photoresist,
wherein the photoresist pattern exposes a portion of an upper surface of the second anti-reflection film.

* * * * *